United States Patent
Nielsen et al.

(10) Patent No.: US 11,955,942 B2
(45) Date of Patent: Apr. 9, 2024

(54) ACTIVE MULTI-POLE FILTER

(71) Applicant: Anlotek Limited, London (GB)

(72) Inventors: Jorgen Staal Nielsen, Calgary (CA); Richard Nichols, Manhattan Beach, CA (US)

(73) Assignee: Anlotek Limited, London (GB)

( * ) Notice: Subject to any disclaimer, the term of this patent is extended or adjusted under 35 U.S.C. 154(b) by 0 days.

(21) Appl. No.: 17/683,206

(22) Filed: Feb. 28, 2022

(65) Prior Publication Data
US 2022/0278672 A1    Sep. 1, 2022

Related U.S. Application Data

(60) Provisional application No. 63/154,724, filed on Feb. 27, 2021.

(51) Int. Cl.
*H03H 11/04*    (2006.01)

(52) U.S. Cl.
CPC ......... *H03H 11/04* (2013.01); *H03H 2210/01* (2013.01)

(58) Field of Classification Search
None
See application file for complete search history.

(56) References Cited

U.S. PATENT DOCUMENTS

| | | | |
|---|---|---|---|
| 1,570,771 A | 1/1926 | Nyquist | |
| 1,778,085 A | 10/1930 | Nyquist | |
| 1,915,440 A | 6/1933 | Nyquist | |
| 1,926,169 A | 9/1933 | Nyquist | |
| 2,099,769 A | 11/1937 | Nyquist | |
| 3,720,881 A | 3/1973 | Hurtig, III | |
| 5,220,686 A | 6/1993 | Kasperkovitz et al. | |
| 5,291,159 A | 3/1994 | Vale | |

(Continued)

FOREIGN PATENT DOCUMENTS

| | | |
|---|---|---|
| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Daniel C Puentes
(74) *Attorney, Agent, or Firm* — CHRISTENSEN O'CONNOR JOHNSON KINDNESS PLLC

(57) ABSTRACT

An RF signal is processed by coupling an input signal into a signal loop, the signal loop comprising a resonator and a processing block, and filtering the input signal in the signal loop to produce an output signal by obtaining a plurality of resonator outputs from the resonator and processing the plurality of resonator outputs to generate feedback signals. The feedback signals are connected to a point upstream of the resonator. At least one of the plurality of resonator outputs is processed in the processing block. The signal loop is definable by a transfer function having poles, and the plurality of resonator outputs are processed such that the poles of the transfer function are independently controllable.

22 Claims, 30 Drawing Sheets

(56) References Cited

U.S. PATENT DOCUMENTS

| | | |
|---|---|---|
| 5,311,198 A | 5/1994 | Sutton |
| 5,854,593 A | 12/1998 | Dykema et al. |
| 5,917,387 A | 6/1999 | Rice et al. |
| 5,949,290 A | 9/1999 | Bertram |
| 6,057,735 A | 5/2000 | Cloutier |
| 6,236,281 B1 | 5/2001 | Nguyen et al. |
| 6,420,913 B1 | 7/2002 | Freeman |
| 6,452,465 B1 | 9/2002 | Brown et al. |
| 6,496,075 B2 | 12/2002 | Justice et al. |
| 6,587,007 B2 | 7/2003 | Exeter |
| 6,650,195 B1 | 11/2003 | Brunn et al. |
| 6,771,147 B2 | 8/2004 | Mongia |
| 6,865,387 B2 | 3/2005 | Bucknell et al. |
| 6,898,450 B2 | 5/2005 | Eden et al. |
| 6,920,315 B1 | 7/2005 | Wilcox et al. |
| 6,937,877 B2 | 8/2005 | Davenport |
| 6,941,118 B2 | 9/2005 | Yamamoto |
| 6,954,774 B1 | 10/2005 | Mulbrook |
| 7,098,751 B1 | 8/2006 | Wong |
| 7,151,925 B2 | 12/2006 | Ting et al. |
| 7,158,010 B2 | 1/2007 | Fischer et al. |
| 7,174,147 B2 | 2/2007 | Toncich et al. |
| 7,346,330 B2 | 3/2008 | Kawabe et al. |
| 7,400,203 B2 | 7/2008 | Ojo et al. |
| 7,414,779 B2 | 8/2008 | Huber et al. |
| 7,423,502 B2 | 9/2008 | Razafimandimby et al. |
| 7,433,668 B2 | 10/2008 | Fischer et al. |
| 7,509,141 B1 | 3/2009 | Koenck et al. |
| 7,522,016 B2 | 4/2009 | Toncich et al. |
| 7,809,410 B2 | 10/2010 | Palum et al. |
| 7,917,117 B2 | 3/2011 | Zafonte |
| 7,937,076 B2 | 5/2011 | Zeller et al. |
| 8,000,379 B2 | 8/2011 | Kishigami et al. |
| 8,050,708 B2 | 11/2011 | March et al. |
| 8,103,213 B2 | 1/2012 | Tolonen |
| 8,106,727 B2 | 1/2012 | Kawai et al. |
| 8,107,939 B2 | 1/2012 | Hassan et al. |
| 8,120,536 B2 | 2/2012 | Lindmark |
| 8,140,033 B2 | 3/2012 | Chan Wai Po et al. |
| 8,253,514 B2* | 8/2012 | Kharrat ............ H03H 9/525 333/197 |
| 8,294,537 B2 | 10/2012 | Kawai et al. |
| 8,565,671 B2 | 10/2013 | Robert et al. |
| 8,767,871 B2 | 7/2014 | Park et al. |
| 8,922,294 B2 | 12/2014 | Tsuzuki et al. |
| 8,981,875 B2 | 5/2015 | Park |
| 9,024,709 B2 | 5/2015 | Joshi et al. |
| 9,083,351 B1 | 7/2015 | Lee et al. |
| 9,129,080 B2 | 9/2015 | Tsuzuki et al. |
| 9,184,498 B2 | 11/2015 | Schiller |
| 9,231,712 B2 | 1/2016 | Hahn et al. |
| 9,407,239 B2 | 8/2016 | White et al. |
| 9,634,390 B2 | 4/2017 | Onaka |
| 9,641,138 B2 | 5/2017 | Zhu |
| 9,698,747 B2 | 7/2017 | Ishizuka |
| 10,050,604 B2 | 8/2018 | Nielsen et al. |
| 10,228,927 B2 | 3/2019 | Choi et al. |
| 10,236,899 B1 | 3/2019 | Tope et al. |
| 10,396,807 B1 | 8/2019 | Dai et al. |
| 11,290,084 B2 | 3/2022 | Nielsen et al. |
| 2001/0043116 A1 | 11/2001 | Waltman |
| 2004/0030108 A1 | 2/2004 | Pihlava et al. |
| 2005/0003785 A1 | 1/2005 | Jackson et al. |
| 2007/0010217 A1 | 1/2007 | Takahashi et al. |
| 2007/0195915 A1 | 8/2007 | Ko et al. |
| 2007/0296513 A1 | 12/2007 | Ruile et al. |
| 2009/0322445 A1 | 12/2009 | Raidl et al. |
| 2010/0097152 A1 | 4/2010 | Wang et al. |
| 2010/0141355 A1 | 6/2010 | Kharrat et al. |
| 2011/0002080 A1 | 1/2011 | Ranta |
| 2011/0187448 A1 | 8/2011 | Koechlin |
| 2013/0065542 A1 | 3/2013 | Proudkii |
| 2013/0142089 A1 | 6/2013 | Azarnaminy et al. |
| 2013/0293291 A1 | 11/2013 | Shanan |
| 2014/0266454 A1 | 9/2014 | Testi et al. |
| 2014/0361839 A1 | 12/2014 | Scott et al. |
| 2016/0072442 A1 | 3/2016 | Testi et al. |
| 2016/0164481 A1 | 6/2016 | Madan et al. |
| 2017/0149411 A1 | 5/2017 | Nielsen et al. |
| 2019/0363698 A1* | 11/2019 | Nosaka ............ H03H 9/725 |
| 2020/0014382 A1 | 1/2020 | Ranta |
| 2021/0067125 A1 | 3/2021 | Nielsen |

FOREIGN PATENT DOCUMENTS

| | | |
|---|---|---|
| CN | 108463949 B | 7/2022 |
| EP | 1675263 A1 | 6/2006 |
| EP | 3062442 A1 | 8/2016 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2009114123 A2 | 9/2009 |
| WO | 2011/103108 A1 | 8/2011 |
| WO | 2015/176041 A1 | 11/2015 |

OTHER PUBLICATIONS

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHZ Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems-II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems-I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems-II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.

International Search Report and Written Opinion dated Feb. 8, 2017, issued in corresponding International Application No. PCT/GB2016/053686, filed Nov. 23, 2016, 10 pages.

Kuhn, W.B., et al., "Q-Enhanced LC Bandpass Filters for Integrated Wireless Applications," IEEE Transactions on Microwave Theory and Techniques 46(12):2577-2586, Dec. 1998.

Luo, X., et al., "Tunable Bandpass Filter With Two Adjustable Transmission Poles and Compensable Coupling," IEEE Transactions on Microwave Theory and Techniques 62(9):2003-2013, Sep. 2014.

(56) References Cited

OTHER PUBLICATIONS

Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.

Piazza, G., "MEMS Resonators for Frequency Control and Sensing Applications," presentation, University of Pennsylvania, Philadelphia [at least as early as Apr. 24, 2015], 104 pages.

Psychogiou, D., et al., "V-Band Bandpass Filter With Continuously Variable Centre Frequency," IET Microwaves, Antennas & Propagation 7(8):701-707, Jun. 2013.

Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.

Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.

Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.

Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.

Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.

Wang, S., and R.-X. Wang, "A Tunable Bandpass Filter Using Q-Enhanced and Semi-Passive Inductors at S-Band in 0.18-µM CMOS," Progress in Electromagnetics Research B 28:55-73, 2011.

Written Opinion of the International Preliminary Examining Authority dated Feb. 5, 2018, issued in corresponding International Application No. PCT/GB2016/053686, filed Nov. 23, 2016, 6 pages.

He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.

Gao, W. and W.S. Snelgrove, "A 950MHz Second-Order Integrated LC Bandpass Modulator" 1997 Symposium on VLSI Circuits Digest of Technical Papers, pp. 111-112.

Zumbahlen, Hank: "Chapter 5: Analog Filters ; SECTION 5-6: Filter Realizations" In: "Op Amp Applications Handbook". Dec. 31, 2005, Newnes, Oxford, pp. 5.59-5.100.

Deliyannis, Theodore L, et al.: "5.6 Multiple-Loop Feedback Filters" In: "Continuous-Time Active Filter Design." Jan. 1, 1999, Boca Raton, FL: CRC Press, U.S. Pat. No. 028,016 pp. 162-171.

* cited by examiner

ACTIVE MULTI-POLE FILTER

TECHNICAL FIELD

This relates to a filter for a radio frequency (RF) signal, and in particular, an active multi-pole filter.

BACKGROUND

Tunable radio frequency (RF) filters have used tunable filters in wireless communication as part of the overall processing of received RF signals to extract signal information. Inversely, such tunable filters have been used as part of the process of encoding information onto an RF signal as part of wireless communications.

One type of resonator is an LC tank, although other types of resonators are also known. Within an LC tank, the resonant frequency may be controlled by changing the capacitance, for example via a continuously adjustable capacitor, such as a varactor controlled by a variable bias voltage, or a via a discrete set of capacitances, such as a bank of switched capacitors, or a combination of continuous- and discrete-value capacitances. Other LC resonator implementations that may have a variable L may also be possible.

Such tunable RF filters are generally characterized by control inputs to adjust the center frequency and bandwidth of the resonators that comprise the filter. Issues of operating center frequency, bandwidth, tuning range, resonator stability, and noise creation are a few of the important aspects describing the performance of these tunable RF filters. Additional control of such external factors as temperature or time related component aging need to be considered.

The term radio frequency (RF) is used to imply any frequency that is relatively high and baseband frequency (BB) is used to imply any frequency that is relatively low. Typically, an RF frequency is at least 10 times that of a BB frequency.

When multiple resonators are used in the design and construction of such tunable RF filters, the control of the individual resonators becomes increasingly complex and interconnected. In addition, resonator parameters may be slightly incorrect and may require compensation, such as a fixed value component in a resonator when a variation of this fixed value is necessary.

SUMMARY

According to an aspect, there is provided a method of processing an RF signal, comprising: coupling an input signal into a signal loop, the signal loop comprising a resonator and a processing block; and filtering the input signal in the signal loop to produce an output signal by obtaining a plurality of resonator outputs from the resonator and processing the plurality of resonator outputs to generate feedback signals, the feedback signals being connected to a point upstream of the resonator, at least one of the plurality of resonator outputs being processed in the processing block. The signal loop is definable by a transfer function having poles, and the plurality of resonator outputs are processed such that the poles of the transfer function are independently controllable.

According to other aspects, the method may comprise one or more of the following features: the plurality of resonator outputs may be processed in parallel paths; processing at least one of the plurality of resonator outputs may comprise a domain transfer; processing the plurality of resonator outputs may comprise discrete time processing, continuous time processing, or combinations thereof; the processing of one or more of the plurality of resonator outputs in the processing block may be independently adjusted; the resonator may comprise a non-uniform frequency response, a multi-pole resonator, a plurality of resonators, or combinations thereof; the processing block may synthesize one or more poles, one or more zeroes, or one or more poles and one or more zeroes; the plurality of resonator outputs may be obtained at multiple points in series along the resonator, or comprise time-delayed signals from the resonator; the processing block may comprise one or more feedback loops, one or more feedforward paths, or combinations of one or more feedback loops and one or more feedforward paths within the signal loop.

According to another aspect, there is provided an apparatus for processing an RF signal, comprising a signal loop comprising an input, an output, a resonator, and a feedback path connected to receive a plurality of resonator outputs from the resonator and having a feedback output connected upstream of the resonator. The feedback path may comprise a processing block and is configured to process the plurality of resonator outputs in parallel and introduce feedback output signals at the feedback output. The signal loop may be definable by a transfer function, and the plurality of resonator outputs are processed such that poles of the transfer function are independently controllable.

According to other aspects, the apparatus may comprise one or more of the following features: the processing block may process a plurality of resonator outputs, or the feedback path comprises a signal path in parallel to the processing block; at least one of the plurality of resonator outputs may be processed by transferring domain, discrete time processing, continuous time processing, or combinations thereof; the resonator may comprise a non-uniform frequency response, a multi-pole resonator, a plurality of resonators, or a plurality of resonators comprising at least one multi-pole resonator; the processing block may be configured to synthesize one or more poles, one or more zeroes, or one or more poles and one or more zeroes; the plurality of resonator outputs may be obtained at multiple points in series along the resonator or comprise time-delayed signals from the resonator; the processing block may comprise one or more feedback paths, one or more feedforward paths, or combinations of one or more feedback loops and one or more feedforward paths around the resonator.

According to an aspect, there is provided a method of processing an RF signal, comprising: coupling an input signal into a signal loop, the signal loop comprising a resonator and a processing block; and filtering the input signal in the signal loop to produce an output signal by: obtaining a plurality of resonator outputs from the resonator, and processing the plurality of resonator outputs in parallel in the processing block; wherein the signal loop is definable by a transfer function, and the plurality of resonator outputs are processed such that poles of the transfer function are individually controllable.

According to other aspects, the method may comprise one or more of the following features, alone or in combination: processing at least one of the plurality of resonator outputs may comprise a domain transfer; processing the plurality of resonator outputs may comprise discrete time processing, continuous time processing, or a combination thereof; the method may comprise the step of independently adjusting the processing of one or more of the plurality of resonator outputs in the processing block; the resonator may comprise a non-uniform frequency response; the resonator may comprises a multi-pole resonator and/or a plurality of resonators;

the processing block may synthesize one or more poles, one or more zeroes, or both one or more poles and one or more zeroes; the plurality of resonator outputs may be obtained at multiple points in series along the resonator; the plurality of resonator outputs may comprise time-delayed signals from the resonator; the resonator may be frequency tunable, Q-adjustable, or frequency tunable and Q-adjustable; the resonator may be a fixed frequency resonator or a variable frequency resonator; the resonator may comprise an active feedback filter; the signal loop may comprise one or more nested feedback loops; the processing block may comprise one or more feedback loops, one or more feedforward paths, or combinations of one or more feedback loops and one or more feedforward paths within the signal loop.

According to an aspect, there is provided an apparatus for processing an RF signal, comprising a signal loop comprising an input, an output, a resonator, and a processing block. The processing block is connected to receive a plurality of resonator outputs from the resonator and configured to process the plurality of resonator outputs in parallel. The signal loop is definable by a transfer function, and the plurality of resonator outputs are processed such that poles of the transfer function are individually controllable.

According to other aspects, the apparatus may comprise one or more of the following features, alone or in combination: the processing block may be adapted to process at least one of the plurality of resonator outputs by transferring domain; the plurality of resonator outputs may comprise discrete time processing, continuous time processing, or a combination thereof; the resonator may comprise a non-uniform frequency response; the resonator may comprise a multi-pole resonator and/or a plurality of resonators; the processing block may be configured to synthesize one or more poles, one or more zeroes, or both one or more poles and one or more zeroes; the plurality of states may be obtained at multiple points in series along the resonator; the plurality of states may comprise time-delayed signals from the resonator; the resonator may be frequency tunable, Q-adjustable, or frequency tunable and Q-adjustable; the resonator may be a fixed frequency resonator or a variable frequency resonator; the resonator may comprise an active feedback filter; the signal loop may comprise one or more nested feedback loops; the processing block may comprise one or more feedback loops, one or more feedforward paths, or combinations of one or more feedback loops and one or more feedforward paths within the signal loop.

According to an aspect, there is provided a method of processing an RF signal, comprising: coupling an input signal into a signal loop, the signal loop comprising a resonator; filtering the input signal in the signal loop to produce an output signal by obtaining a plurality of resonator outputs from the resonator and processing the plurality of resonator outputs to generate feedback signals upstream of the resonator in a first path and a second path that is connected in parallel with the first path, wherein the second path comprises a domain transformation. The signal loop is definable by a transfer function, and the plurality of resonator outputs are processed such that poles of the transfer function are individually controllable.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION OF PREFERRED EMBODIMENTS

Tunable bandpass filters (BPF) typically rely on resonator processing control to refine the frequency selectivity of the filter when processing a signal. Generally, the processing relates to the ability to adjust the center frequency and the bandpass region. Also, in general, to control the bandwidth of the signal processing, active feedback in the form of a feedback gain element may be used to provide this bandwidth control in a method called Q-enhancement.

Further, methods involving bandwidth control generally refer to the movement of the resonator pole or poles in the s-plane, which are a point of focus in design analysis. A resonator may have more than a single pole.

The context of the discussion herein will be this more complex active feedback resonator signal processing. Other control strategies that are not discussed may also be used, such as the use of Q-spoiling to reduce the Q of the filter. While the discussion focuses primarily on this active feedback filter in signal processing, it may also apply to other tunable filters, such as those that do not have active feedback.

Figure 1:
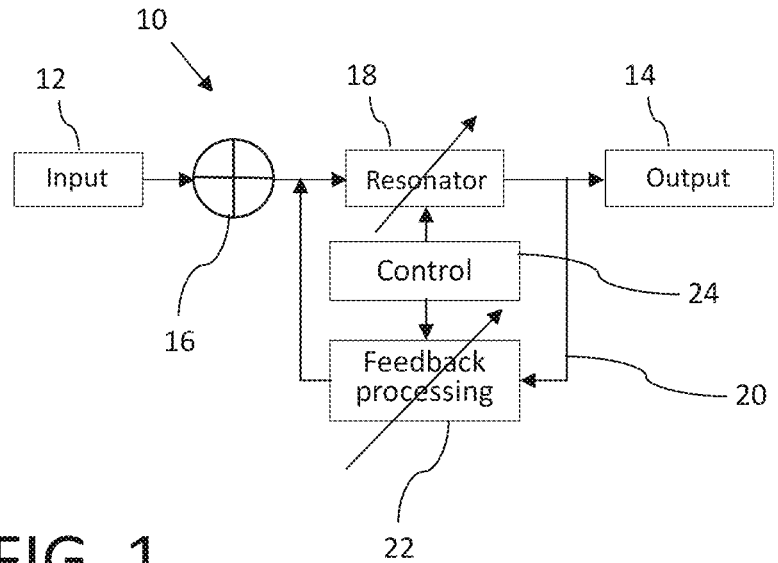
FIG. 1 is schematic diagram of an active feedback filter (APP).

The active feedback filter 10 (AFF) shown in FIG. 1 has four main components with an input port 14 and an output port 14. These components are a sum block 16, a resonator 18, an active feedback path 20 that contains feedback processing 22, and the overall control element 24 of both feedback processing 22 and resonator 18. Care of port matching and controlling losses may be used in implementations of the principles disclosed herein, however these engineering design details are not considered further.

Figure 2:
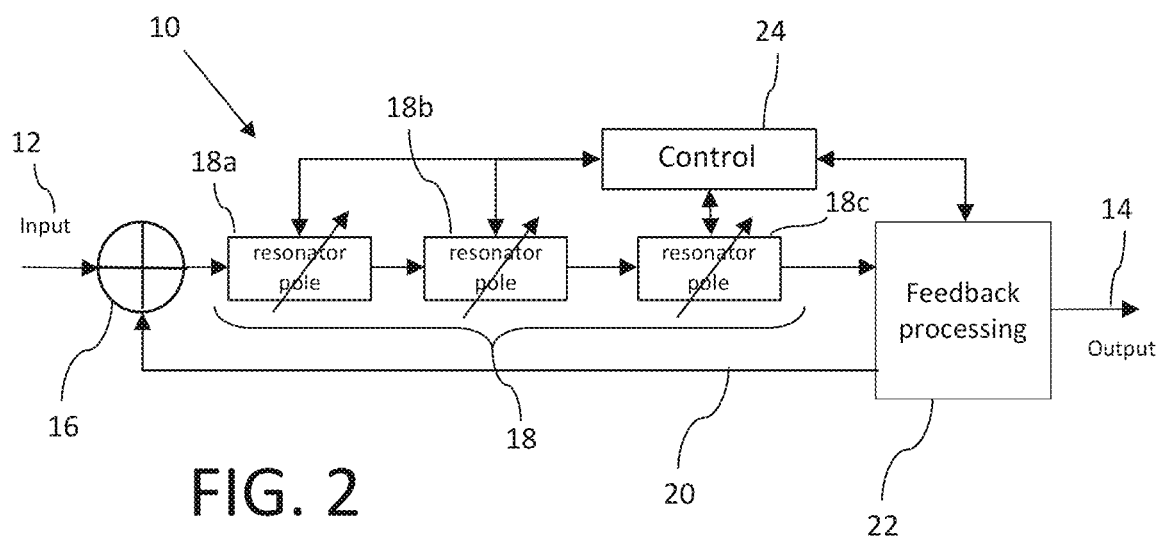
FIG. 2 is a schematic diagram of a multiple resonator filter with feedback processing and control.

Variants of the AFF shown in FIG. 1 may include:
a. resonator 18 may contain more than one pole and that one of these poles may be Q-enhanced (moved toward the jω axis), or Q-spoiled (moved away from the jω axis).
b. feedback processing 22 may contain phase adjustments. These phase adjustments may be fixed or variable.
c. The components may be connected in different orders.
d. Input and output ports 12 and 14 may be associated with other points in the loop The active feedback causes the pole(s) of resonator 18 to shift in position in the complex s-plane. Referring to FIG. 2, other filter architectures may include multiple resonators 18, where each resonator may have a different pole(s) from other resonators 18 in the architecture.

To maintain simplicity, only the arrangement of APP 10 in FIG. 1 will be considered herein. However, it is understood that variations of AFF 10 may include examples such as multiple resonators 18 connected either in series or in parallel within one filter section, and parallel or series combinations of multiple filter sections.

A simplified example of feedback processing 22 may include a gain block representing a scaling factor. By setting this scaling factor, the dominant resonator poles may be moved toward the jω axis of the s-plane, which is Q enhancement, or away from the jo) axis, which is Q spoiling. With a variable feedback gain, the level of Q enhancement or Q spoiling may be controlled. Also, by making the resonator pole variable, the frequency of the Q-modified dominant pole may be tuned.

Next consider a resonator 18 that contains P>1 poles, such as is shown in FIG. 2, with P=3 poles 18a, 18b, and 18c.

When resonator 18 is a passive circuit network of reactive components with poles of modest Q, external control 24 may shift the poles along the jω axis but with modest resolution. Also, the poles may be coupled such that external control 24 affects all of the resonator poles of resonator 18 with generally an undesired coupling. That is, resonator 18 may consist of P>1 poles and that a control input may affect all the pole positions in the s-plane without the ability of shifting a single pole in isolation.

When the feedback is active, it may be possible to move the poles closer to the jω axis than is possible when using only the resonator external control.

Generalized Feedback Domain and Control Processing

Figure 3:
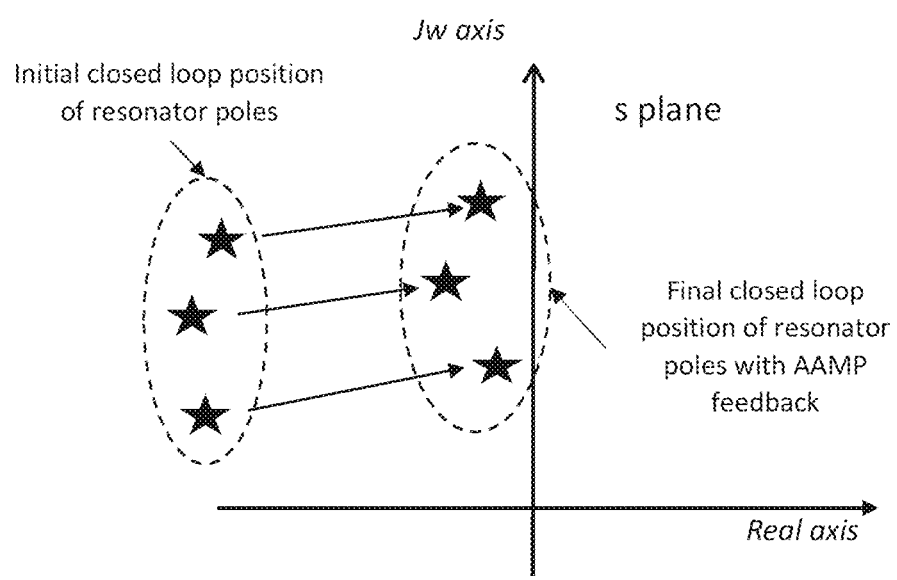
FIG. 3 is a plot of individual pole placement of the 3-pole resonator of FIG. 2 enabled by AMPP (active multi-pole placement) processing.

The feedback processing presented herein may be used to control the position of the P poles on an individual pole-by-pole basis as shown in FIG. 3. Note that resonator poles may be moved along the real axis changing Q, and/or along the jω axis changing frequency. With this, the P poles of resonator 18 may be placed to provide an arbitrary bandpass transfer function response. This is desired for implementing a passband filter of specified passband characteristics and out of band rejection. As the active feedback affects all P poles in a desired way, a generalized active multi-pole placement 30 (AMPP) may result.

Figure 6:
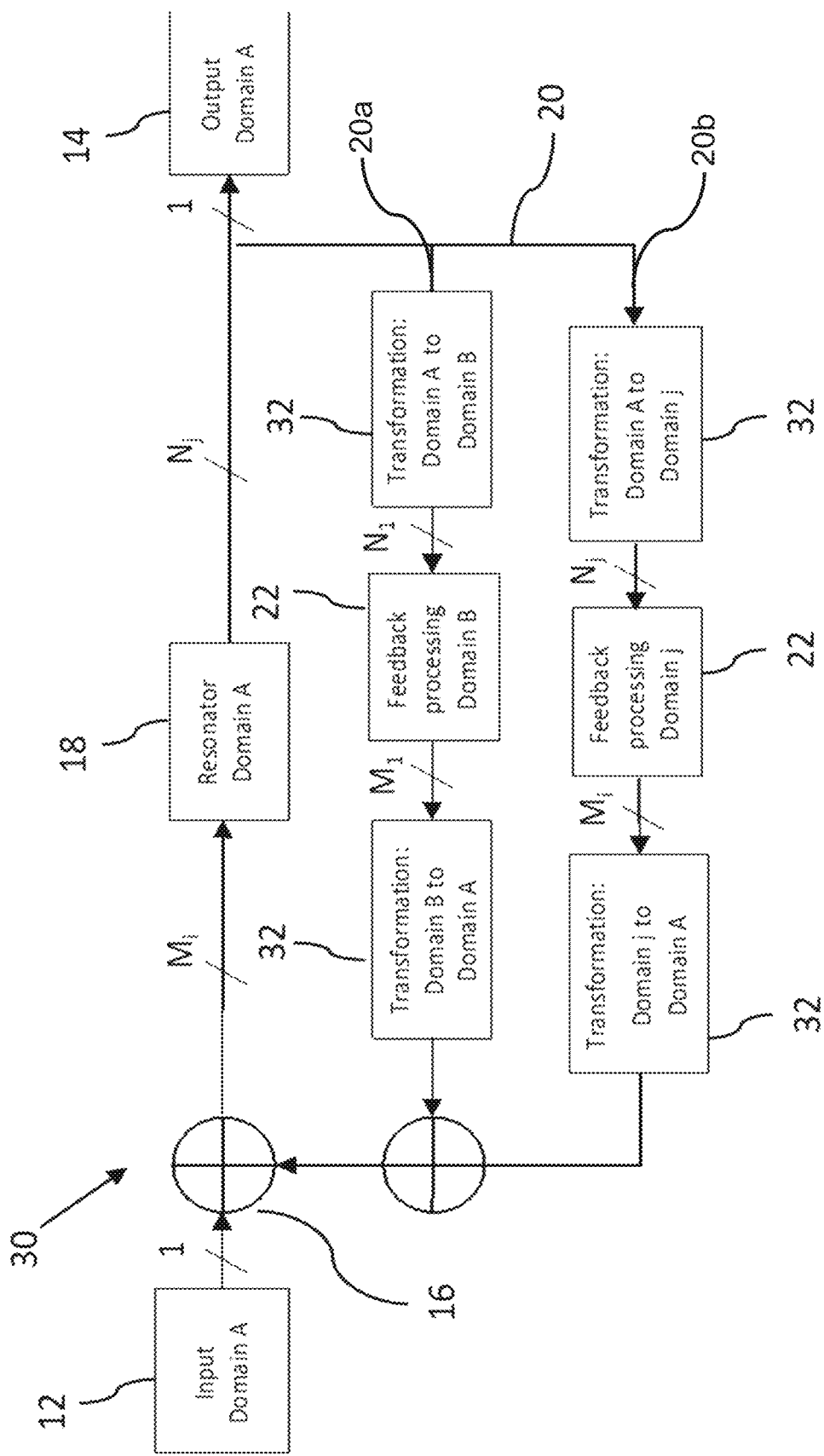
FIG. 6 is a schematic diagram of a further example of AMPP feedback processing.
Figure 41:
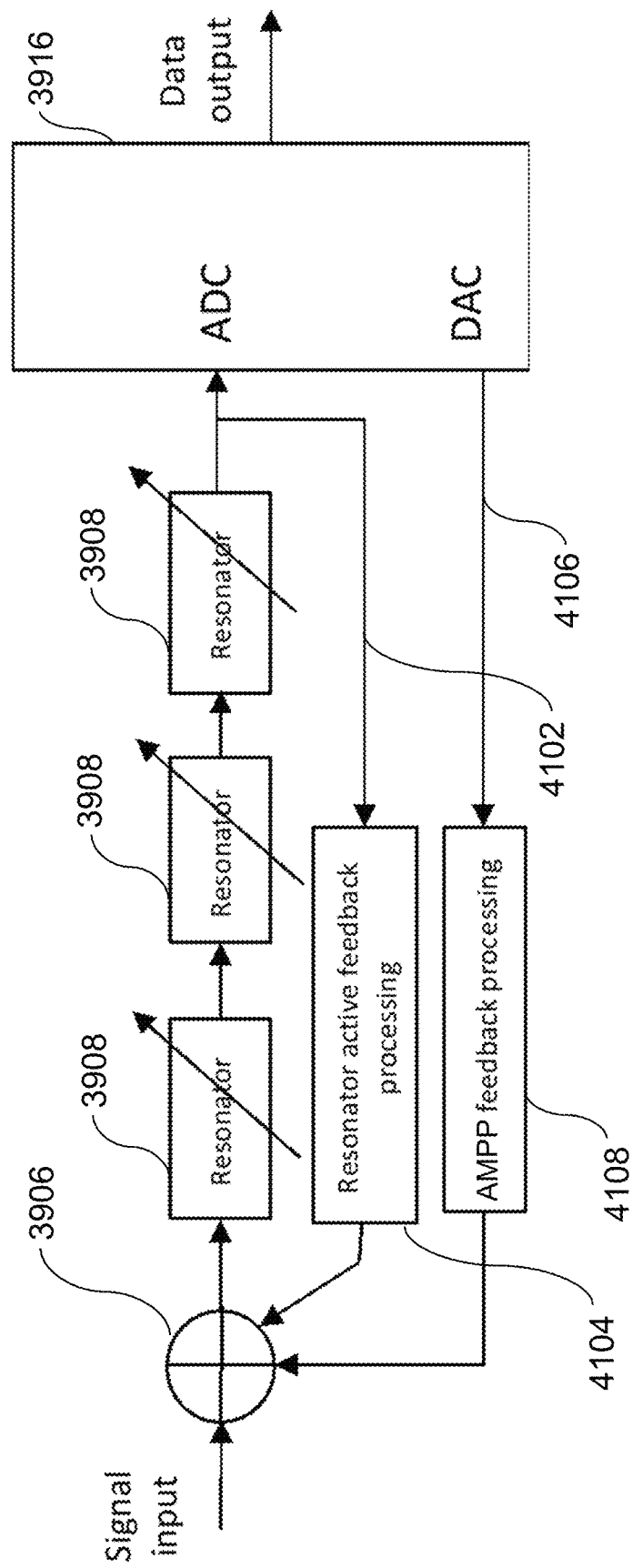
FIG. 41 is a schematic diagram of a feedback loop with two processing paths.
Figure 42:
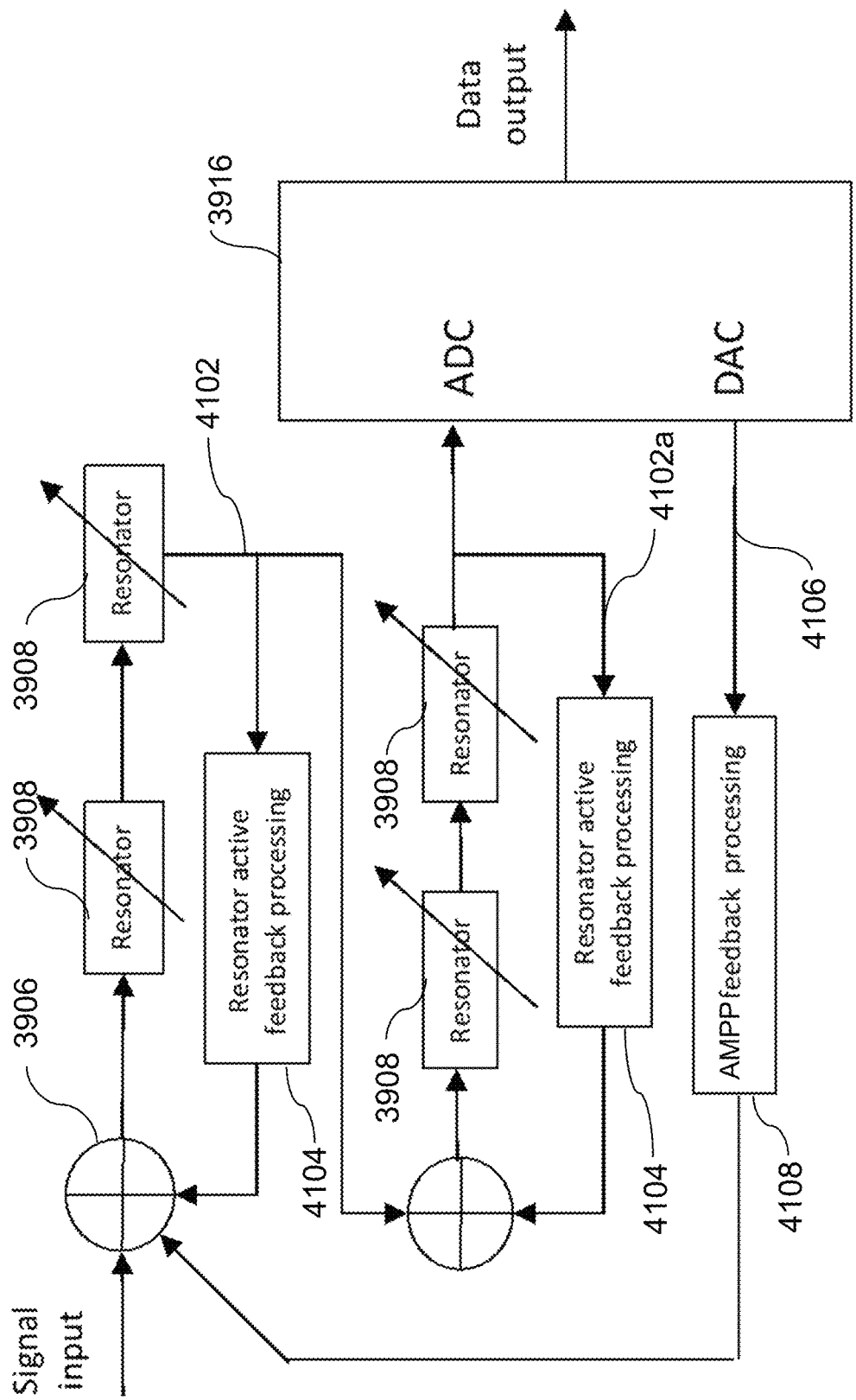
FIG. 42 is a schematic diagram of a combination of various processing paths.
Figure 43:
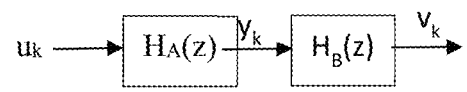
FIG. 43 is a schematic diagram depicting a cascade of the two transfer functions.

It may be possible with feedback processing to independently control each pole, or in other words, simultaneously place each of the resonator poles individually in the s-plane, individually controlling both the bandwidth of the resonator (pole movement parallel to the horizontal axis) and the resonator frequency (pole movement parallel to the vertical axis). The feedback processing may be performed in a processing block 22, or in parallel paths as shown in FIG. 6, which may have separate processing blocks 22, or as shown in FIGS. 41 and 42, which may have separate processors 4104 and 3916 for parallel paths. Alternatively, one or more of the parallel paths may include passive components, rather than active processing components as shown.

There will now be considered the feedback processing of the AFF 10 which may be used to achieve an active multi-pole placement APP 30. Generalized control theory concepts will be introduced, applied to the feedback processing functions with control made possible in different processing domains that may characterize an observable, such as frequency or phase, out of the resonator. The signal in the AFF 10 loop in FIG. 1 is in the RF analog domain. The resonator output will be referred to as an RF analog signal also with domain A.

Figure 4:
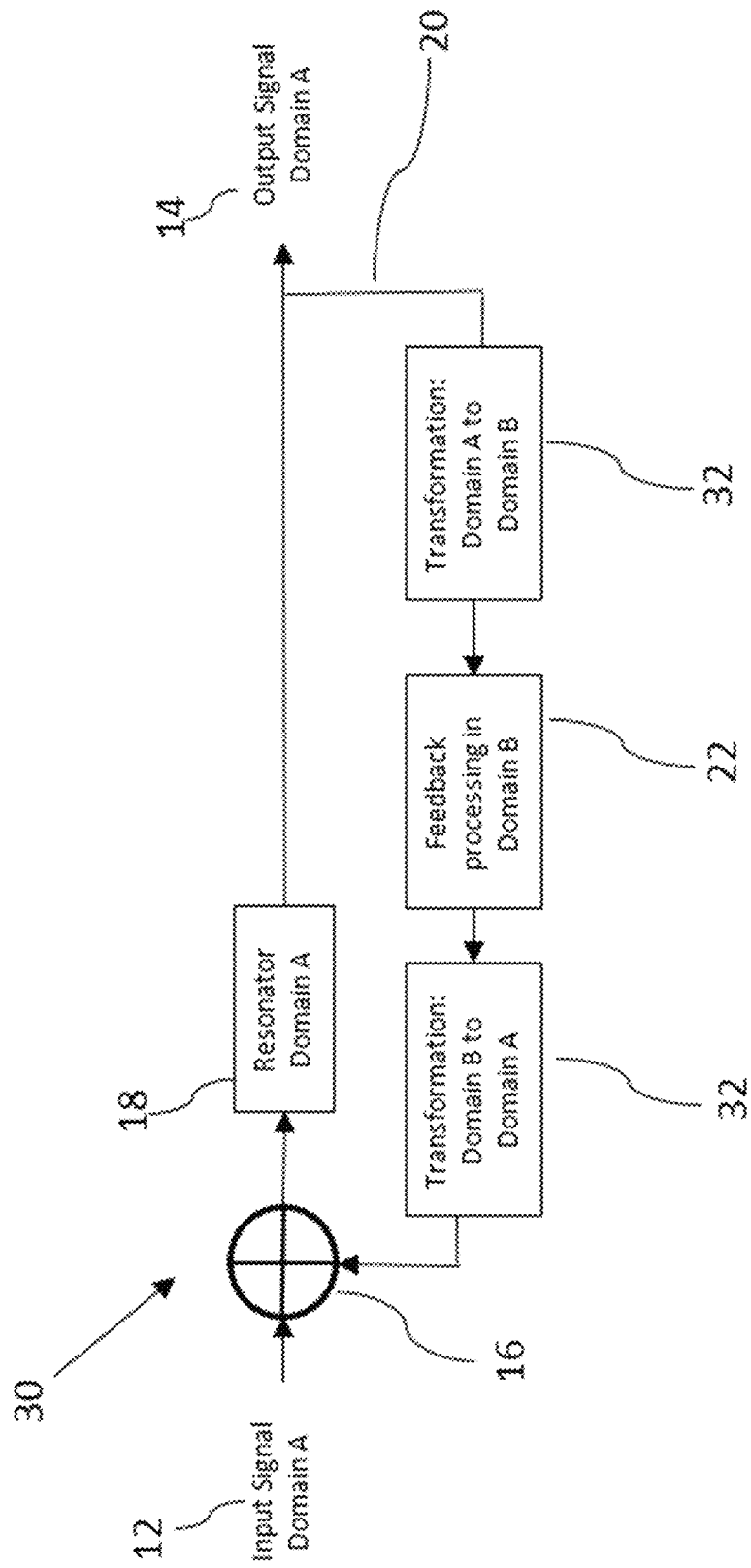
FIG. 4 is a schematic diagram of a generalization of an AMPP with a feedback processing block in domain B that is a different state than that of domain A.

A characteristic of AMPP 30 may include the state space domain transformation within the feedback loop as shown in FIG. 4. Input signal 12, resonator 18 and output signal 14 will be considered in domain A. Within the AMPP 30 loop there may be a transformation 32 to another domain B with feedback processing 22 in domain B followed by a transformation 32 back to domain A Multiple parallel processing in multiple domains may be implemented.

Figure 5:
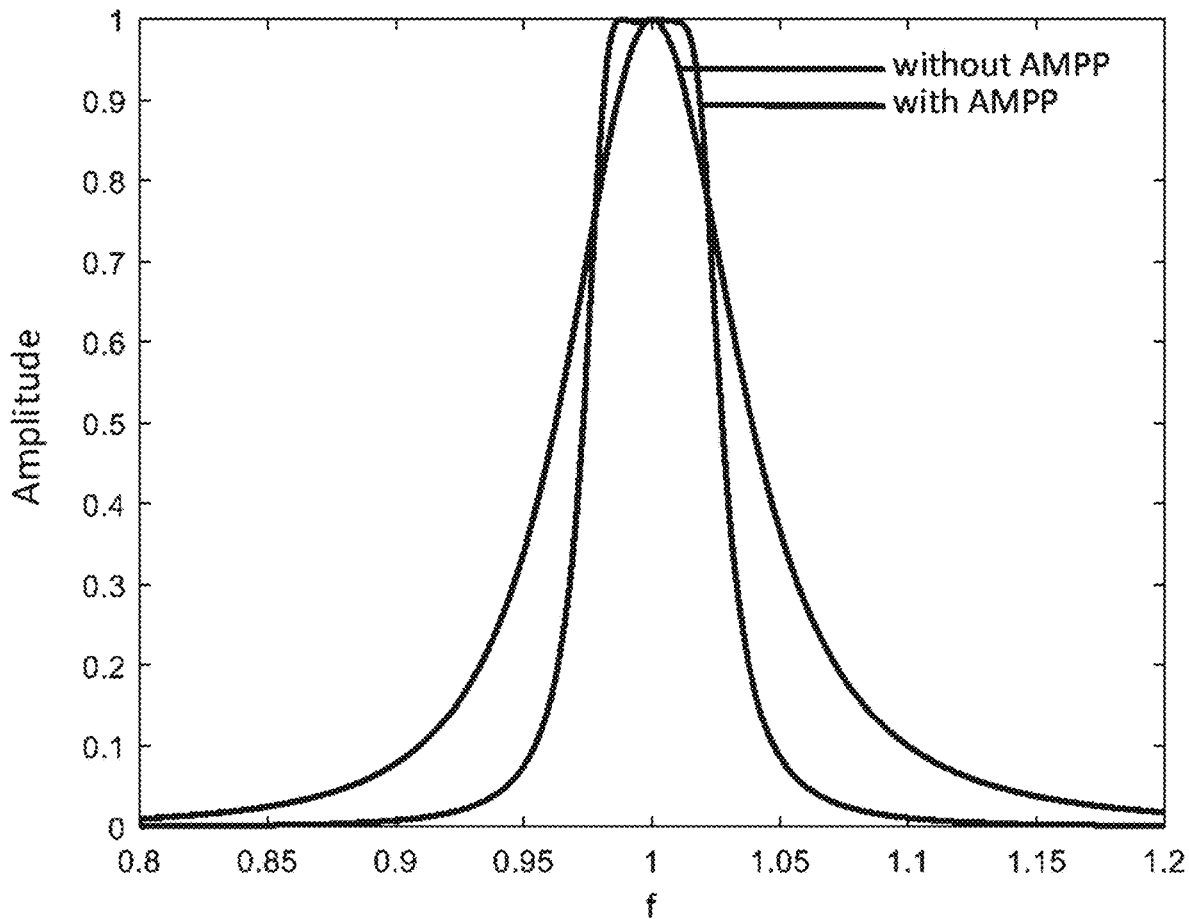
FIG. 5 is a plot of the frequency response of third order AMPP resonator compared to a non-AMPP third order resonator.

As is discussed below, the result of an AMPP-enabled three pole resonator 30 shown in FIG. 4 may be used to provide significantly increased bandwidth as shown in FIG. 5.

Referring again to FIG. 4, in AMPP 30, the domain A may be RF analog, and domain B may be different than domain A, of which there are several possibilities, examples of which include:

RF analog domain B at a different frequency than domain A

Low frequency baseband analog domain

Discrete time sampled domain (analog discrete time samples of signal)

Digital domain (digitized discrete time samples of signal)

An advantage of this domain transformation may be that the feedback processing in a different domain than that of the RF signal domain A is often simpler and more practical to implement. For instance, if domain B is digital, then the feedback processing may be implemented in digital signal processing (DSP). Complex processing functions may be readily implemented in DSP that are not practical to implement in analog RF.

A typical application of AFF 10 may include narrow bandwidth filtering of a wireless signal intercepted by the antenna prior to down conversion and digitization. Interference and noise outside of the desired signal bandwidth may swamp the desired signal such that the desired signal may be irreversibly corrupted in the down conversion and digitization process. Hence a bandpass filter commensurate with the desired signal bandwidth is necessary to suppress this interference and noise. With AMPP 30, more complexity in the feedback signal may be robustly implemented.

Additionally, AMPP 30 may tolerate the large signal amplitudes that may be present in filters of high Q poles as the pole energy storage becomes large. This allows for feedback synthesis to be based on multi-dimensional state-space processing. As will be developed, this allows for the plurality of resonator poles to be simultaneously Q enhanced and arbitrarily placed in the s-plane with a single feedback loop. Thus, complex tunable multi-pole bandpass filter responses may be synthesized.

Figure 7:
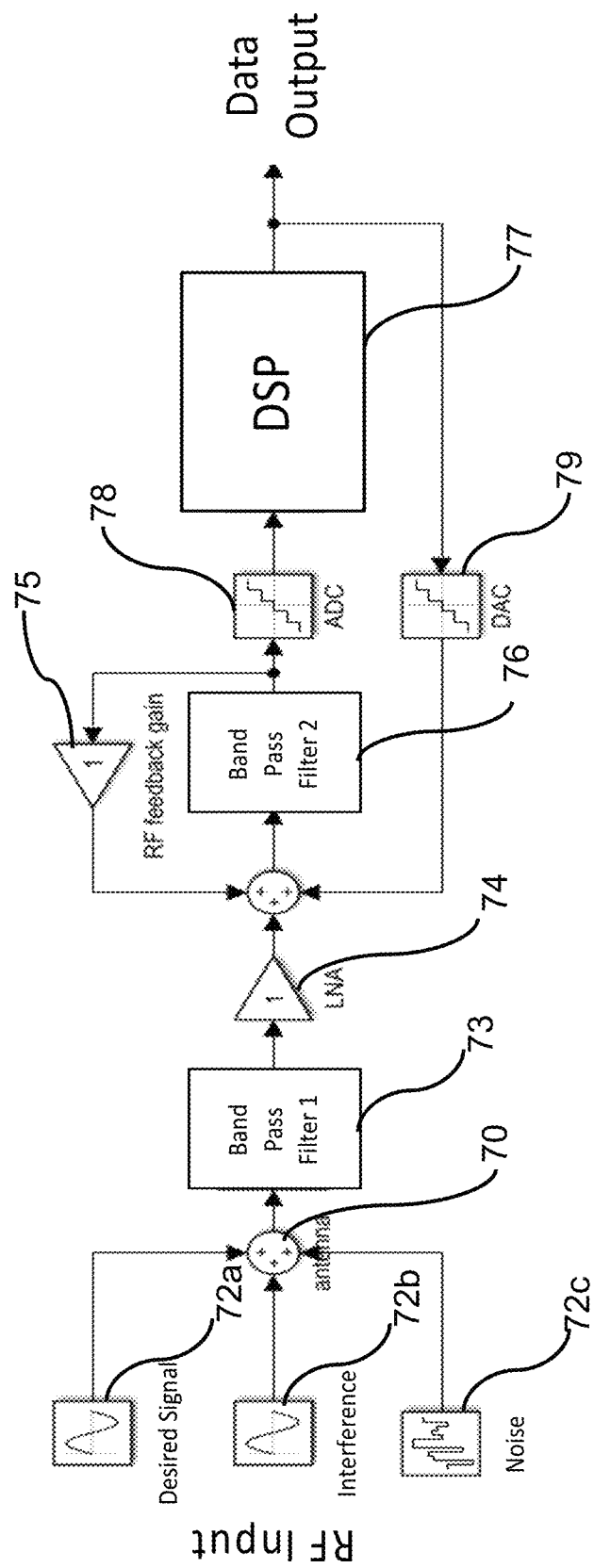
FIG. 7 is a schematic diagram of a signal processing path of a wireless signal showing input RF signal on the left and data output on the right.

In some examples, there may be a plurality of observations emanating from resonator 18 which are linearly independent, and which may be simultaneously transformed in parallel into a plurality of domains and acted on by a plurality of feedback domain processors. These pluralities of linearly independent signals, produced by the plurality of parallel feedback processing paths, may be simultaneously fed back into the resonator after transformation back into domain A For example, low Q requires a low latency in the DSP which may not always possible. However low latency may be achieved in an analog domain. This is illustrated in FIG. 6 with multiple parallel feedback processing paths 20a and 20b within signal loop 20. In this example:

Each independent processing path 20a and 20b is fed with state information Nj following resonator 18 in state space domain A;

State information is transformed to domain j;

State information is processed in domain j;

Processed state information is transformed back to domain A;

Post-processing state information in domain A is fed back to the resonator input An example of parallel resonator processing of FIG. 6 is shown in FIG. 7, representing the processing of a radio processing block where the wireless signal is first received by an antenna 70, including a desired signal 72a, interference 72b, and noise 72c, processed by an initial bandpass filter 73, then amplified by amplifier 74 and fed into a processing loop that includes both RF feedback gain 75 around a second bandpass filter 76, and DSP based processing 77, an analog to digital converter 78 and a digital to analog converter 79.

The RF feedback gain 75 may be used for latency mitigation and low Q-enhancement of the received input signal. The DSP block 77 may be for both higher Q-enhancement and general signal processing for data extraction.

Referring again to FIG. 4, the AMPP 30 circuit may be generally described as having resonator 18 and processing block 22 in a signal loop 20. As will be understood, resonator 18 and processing block 22 may be varied to achieve the desired results. For example, resonator 18 may be any suitable resonator, such as single pole resonator, a multi-pole resonator, a SAW filer, a BAW filter, an active feedback filter, a fixed frequency filter, a variable frequency filter (either continuously variable or with discrete frequencies), etc. Alternatively, resonator 18 may be a complex circuit with multiple resonant components, multiple feedback and/or feedback paths, etc. Processing block 22 may be separate components, and may not be contained within a common housing, or even on a common substrate. It will be understood that processing block 22 may be defined as including different components that act upon an output from the resonator. In some cases, a particular signal path within AMPP 30 may be defined as part of resonator 18 or as part of processing block 22. This is primarily one of convenience in understanding and controlling the operation of AMPP 30 and does not change the operation of AMPP 30 or the effect of individual components or signal paths on AMPP 30 as a whole.

Resonator Pole Placement with the AMPP

Referring to FIG. 4, let P be the number of poles of resonator 18 (with positive complex natural mode frequencies). To set the P poles to arbitrary locations represents 2P constraints as each pole has a real and an imaginary component, and feedback processing 22 has a minimum of 2P degrees of freedom (DOF) when acting on the N inputs to produce the M outputs.

Furthermore, it may be assumed that resonator 18 of P poles may be adjusted by externally setting the natural resonance frequency of the individual poles. Hence this is P DOF which implies that feedback processing 22 needs P additional DOF.

Regardless of the details of feedback processor 22, it may require forming approximate derivatives and integrations of the N observables and the forming linear superpositions of sets of variables to form the M outputs. Such linear operations may be trivial to provide if the domain B is DSP. However, if the domain B is analog processing at baseband or RF, then the implementation of linear analog operations may become unwieldy as P increases beyond P=1. Again, the domain transformation within AMPP 30 feedback loop 20 between the domains of A and B allows for domain A to be RF and domain B to be DSP. The DSP allows for a practical implementation of feedback processing 22 such that the P poles may be placed arbitrarily and simultaneously.

Figure 8:
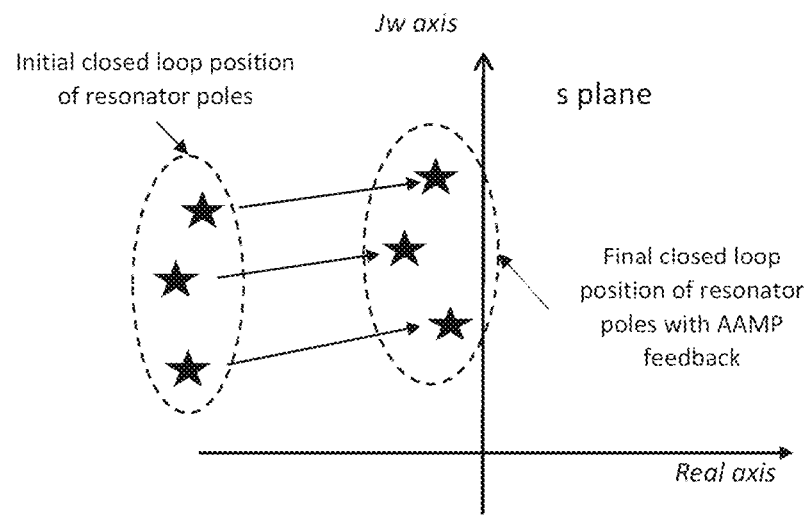
FIG. 8 is a plot of AMPP feedback processing that moves three poles simultaneously.

Based on this, there may be, for example, a multipole resonator 18 with P=3 in AMPP 30 with feedback processor 22 computing the feedback signal that places these three poles as a Chebyshev bandpass filter of order 3. The Chebyshev poles may be placed close to the jω axis to provide a narrowband filter of high frequency selectivity as illustrated in FIG. 8.

General AMPP Resonator Analysis Formalism

There will now be provided a discussion of an example analysis of AMPP 30 resonator.

Figure 9:
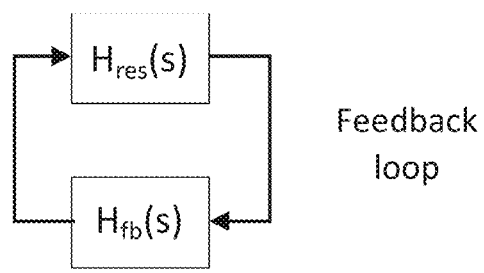
FIG. 9 is a schematic diagram of an AMPP feedback loop with resonator transfer function acted upon by a transfer function in the feedback loop.

Referring to FIG. 9, a resonator may have a transfer function in terms of poles and zeros that may be expressed as $$H_{res}(s) = \frac{N(s)}{D(s)}$$

where N(s) is a numerator polynomial in s (which is the complex frequency of continuous time). D(s) is denominator polynomial in s, and active feedback filter is added that may have a transfer function of $$H_{fb}(s) = \frac{A(s)}{B(s)}$$

where $H_{fp}(s)$ may contain active gain elements.

The closed loop may be given as $$H_{cl}(s) = \frac{H_{res}(s)H_{fb}(s)}{1 - H_{res}(s)H_{fb}(s)} = \frac{NA}{DB - NA}$$

The denominator polynomial (DB-NA) has roots which are the closed loop poles. By design of the feedback polynomials of A and B, the poles may be moved to wherever desired.

Hence the objective of AMPP is to solve for A and B such that the roots of $$DB-NA=0$$

are at the desired s-plane locations.

Figure 10:
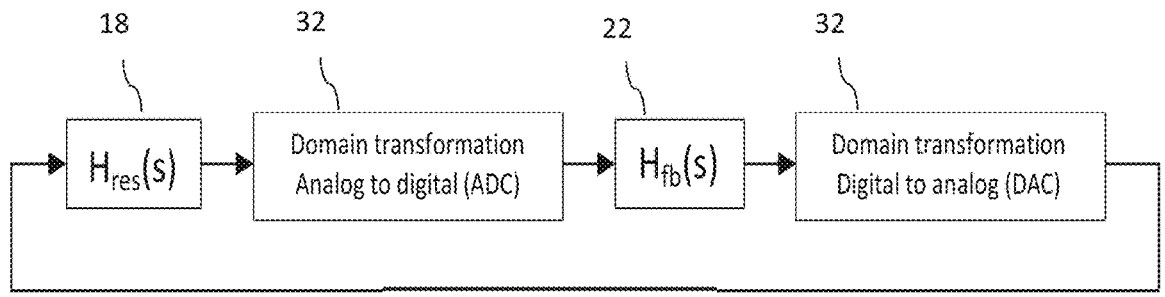
FIG. 10 is a schematic diagram of a feedback loop from a continuous time transfer matrix followed by a transformation from analog to digital, followed by a transfer matrix in the digital domain, and a further transformation matrix back to the input.

It happens that the implementation of $$H_{fb}(s) = \frac{A(s)}{B(s)}$$

may be difficult in continuous time RF space. However, a domain transformation to discrete time space (generally from RF to digital) may be implemented to achieve an equivalent version of the continuous time $H_{fb}(s)$ in the discrete time $H_{fb}(z)$, where the coefficients A and B may be easily changed for different tuning as it is a digital implementation. This process is shown in FIG. 10.

Given $H_{res}(s)$ we can in principle determine the feedback transfer function of $H_{fb}(z)$ such that the desired closed loop passband response is obtained.

Figure 11:
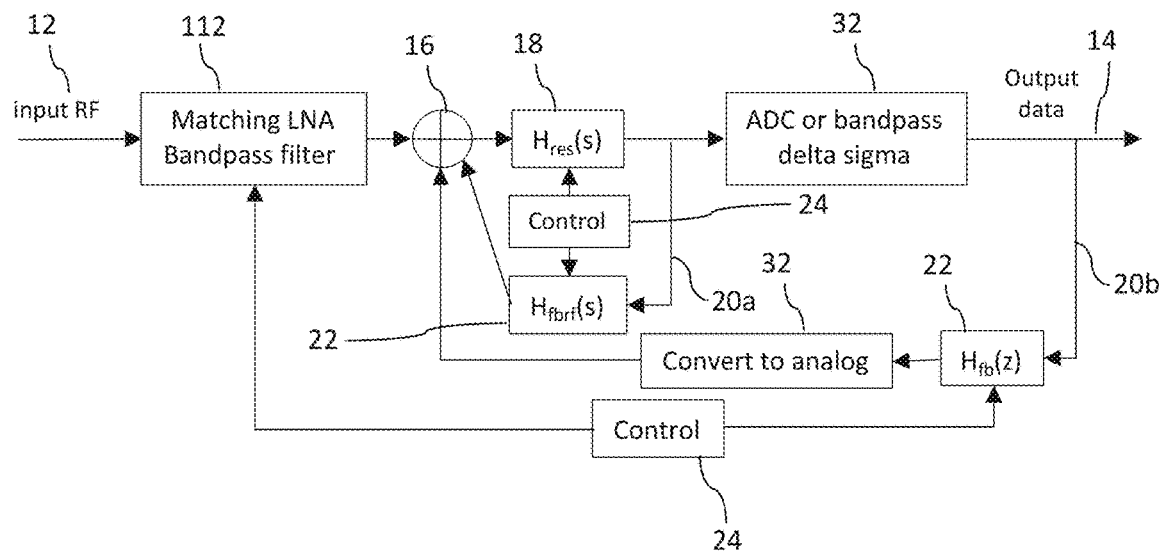
FIG. 11 is a schematic diagram of an AMPP with $H_{res}(s)$ and feedbacks of $H_{fbrf}(s)$ and $H_{fb}(z)$.

Consider the example block diagram in FIG. 11. The front end block 112 may have the antenna matching, LNA (low noise amplifier), bandpass filter and some form of variable gain. This gain may be set such that the SNR (signal-to-noise ratio) of the eventual output may be optimized. That may be a compromise between a) the quantization noise that the ADC generates, and b) the risk of ADC saturation. Protecting the ADC from excess noise is the filter in the front end, which is wideband but may have limited tunability, and $H_{res}(s)$ which is tunable with a resonator LC value change A delta-sigma function is shown merely as an alternate way to move quantization noise out of the passband.

The depicted example has two parallel paths:
1) One feedback path 20a is a direct RF path $H_{fbrf}(s)$ in continuous time for feedback that cannot tolerate delay.
2) A slower feedback 20b includes the $H_{fb}(z)$ block 22 path that is then converted back to analog and loops through $H_{res}(s)$ block 18.

In this way some preliminary Q enhancement of the $H_{res}(s)$ is possible, providing additional mitigation against potential ADC block non-linearities.

Continuous Frequency Transitions using AMPP

Figure 12:
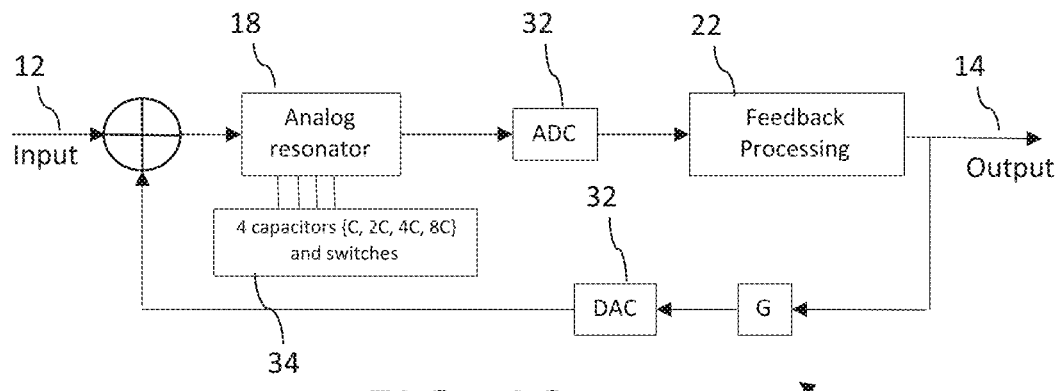
FIG. 12 is a schematic diagram of an analog resonator using a switched capacitor bank and feedback processing.

Referring to FIG. 12, analog resonator 18 may comprise a varactor or a switched capacitor bank 34 for resonance frequency tuning based on a resonant LC tank. However, a varactor of high Q-factor and linearity may be difficult to integrate into a chip circuit. There may also be issues with the bias tuning voltage which must be moderately high to minimize distortion effects. Consequently, the preferred implementation for changing capacitance of the analog LC tank may be via switched capacitor banks 34. Other types of resonators 18 with different considerations may be used.

The domain transformation of AMPP 30 provides the ability to accommodate a resonator 18 that may only be tunable in discrete steps. An example is a resonator 18 using switched capacitors 34 for tuning.

A switched capacitor 34 resonator 18 with K switches may provide for example, 2K discrete natural frequencies of the analog resonator using different combinations of switch positions. As an example, suppose there are capacitors with values of C, 2C, and 4C arranged in parallel with three switches. Then the capacitance values of the set {C, 2C, 3C, 4C, . . . 7C} may be realized by setting the three switches appropriately. A general problem with this switched capacitor resonator is that it only allows for tuning of the frequency in a given number of discrete steps.

However, with the domain feedback processing in AMPP 30, the pole of the switched capacitor resonator 18 may be moved over a small range relative to the capacitor switch 34 settings, but this may be sufficient so that the next switch setting may be used in the RF resonator, enabling continuous frequency changes slightly larger than the frequency band covered by each basic switched capacitor settings.

As will be shown, this may result in continuous frequency tuning over a large range with a continuous change in AMPP 30 feedback processing 22.

A digital resonator may be used as a phase shifter and shift the resonance frequency slightly, but this may be sufficient so that the next switch setting may be used in the RF resonator. An example of a block diagram of the analog resonator 18 switched capacitor bank 34 with four capacitors and feedback processing 22 is shown in FIG. 12.

One specific example of feedback processing is a digital resonator. While a digital resonator may be implemented in a variety of ways, the AMPP may provide a digital resonator within a DSP processing loop. In one example, the AMPP may use feedback processing with a digital domain B to produce a feedback signal from the superposition of the state variables in such a way as to tune the AMPP pole continuously in frequency. This may be extended to a resonator consisting of P poles along with the K sets of switched capacitors.

This principle may be further generalized. Consider a resonator of a plurality of poles that has N different switch settings that may attach or detach a reactive component to the multipole resonator at different and arbitrary points in the resonator. There may be 2N combinations of switches and therefore 2N different arrangements of analog resonator pole positions. In principle, a feedback processor function may be determined for every requirement of AMPP pole positions from each of the 2N resonator configurations. However, there may be a specific resonator configuration for which the feedback signal amplitude is minimal. This is the switch configuration that is selected for the desired output AMPP pole position pattern.

Figure 13A:
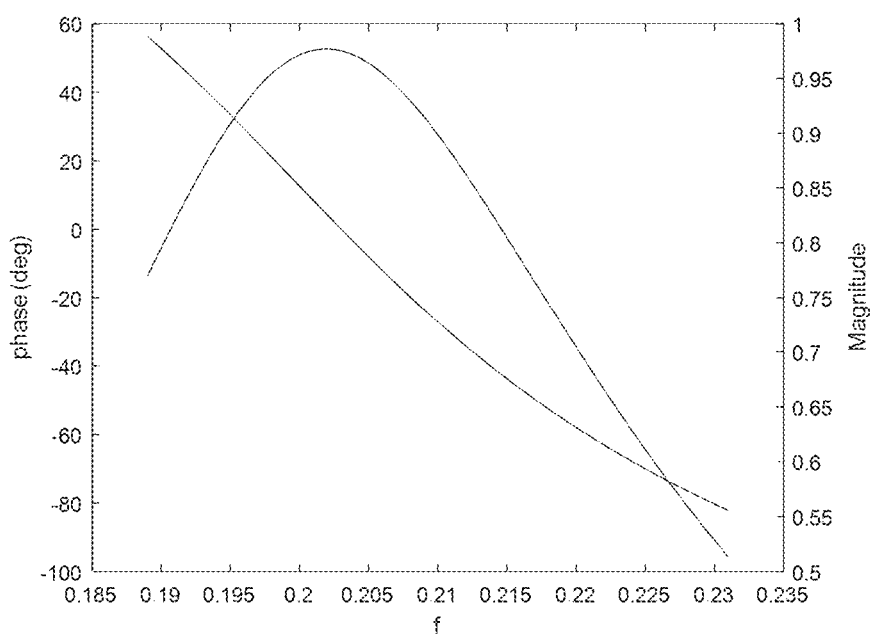
FIG. 13a is a bode plot of NRC with the digital resonator at five percent higher than the RF resonator.
Figure 13B:
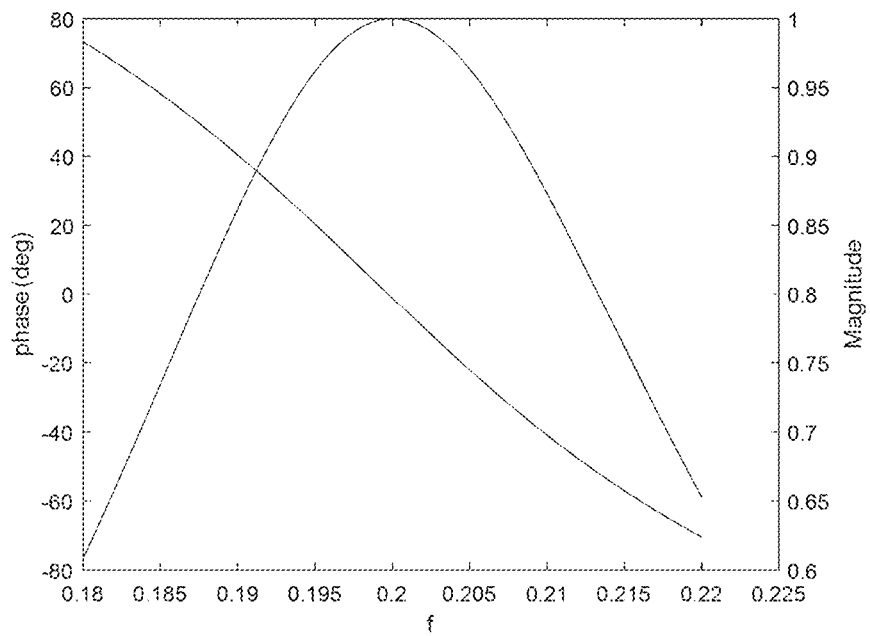
FIG. 13b is a bode plot of NRC with the digital and RF resonator frequency the same.
Figure 13C:
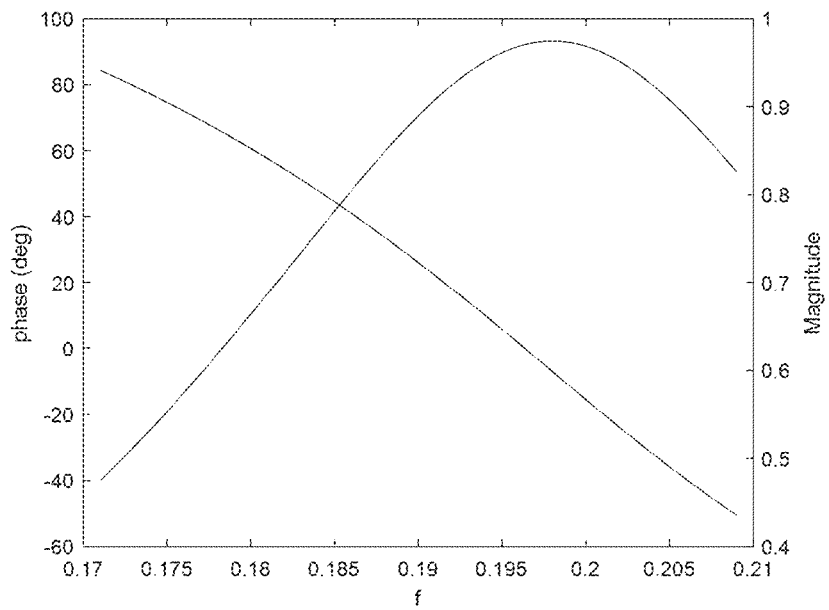
FIG. 13c is a bode plot of NRC with the digital resonator at five percent lower than the RF resonator.

The open loop bode is plotted in FIG. 13a where the digital resonator frequency is five percent lower than the RF resonator frequency. In FIG. 13b the frequencies are the same, and in FIG. 13c the digital is five percent higher. In each case the RF resonator frequency is 0.2 rad/sec. Note that the zero phase crossing is where the AMPP center frequency will be at moderate Q enhancement levels.

The ten percent change in the digital resonator may cause the AMPP center frequency to change about 4 percent. Hence if there are 4 switched capacitors for 16 states, then this may be about a 64 percent change in the AMPP tuning frequency.

Finally note that the amplitude dips slights when the digital resonator is detuned away from the RF resonator. It may be necessary to compensate this with a small increase in G to maintain the precise level of Q enhancement, an adjustment made by the AMPP.

Frequency Tuning a Fixed Frequency Resonator

An RF resonator may be chip integrated or implemented with distributed off-chip components. Consider the fixed frequency resonator for certain applications, represented perhaps as a SAW or a BAW resonator. The generally passive fixed frequency resonators may perform this filtering task effectively with no power requirements and may be designed to tolerate the large interference signals, albeit at a fixed center frequency.

A fixed frequency resonator may be generally a fixed set of poles; poles which may be Q enhanced or Q spoiled as well as frequency shifted as desired following the above principles. A SAW or BAW has a common characteristic of spectral regrowth which may be mitigated following the above principles.

Further, the SAW/BAW may have several passband poles of moderately high Q. However, an issue with the SAW is that it is difficult to control the passband ripple and slope with frequency. Feedback processing necessary for multi-pole placement becomes unwieldy and unreliable if implemented with RF circuitry. Yet such processing is almost trivial to implement in a digital domain where the signals are digitized. Hence the loop should consist of two domains the RF domain for the resonator, and the digital domain for the feedback processing.

By using the AMPP feedback, the multiple poles of the SAW may be moved to more desired locations to provide an even higher Q passband response with very small passband variation, and in the process, suppress spectral regrowth as well. The feedback signal in the AMPP loop may also be large in comparison to the input signal.

With the development of very high speed digital processing, ADCs, and DACs, such a mixed signal loop may be practical to implement. A potential weakness is that the transition from the RF domain state space A to the state space domain B may involve frequency down conversion, sampling, and ADC quantization. These processes may have a relatively high noise figure (NF) and may be susceptible to out of band noise.

The resonators remove a large amount of the out of band noise and interference as it propagates in the loop prior to the domain A to domain B transformation components. The transformation of domain B to domain A involves up-conversion, and DACs which may generate significant out of band frequency spurs and quantization noise. This is largely removed by the resonators before circling back to the A B transformation.

Combined Frequency Translation and Signal Digitization with AMPP

Figure 14A:
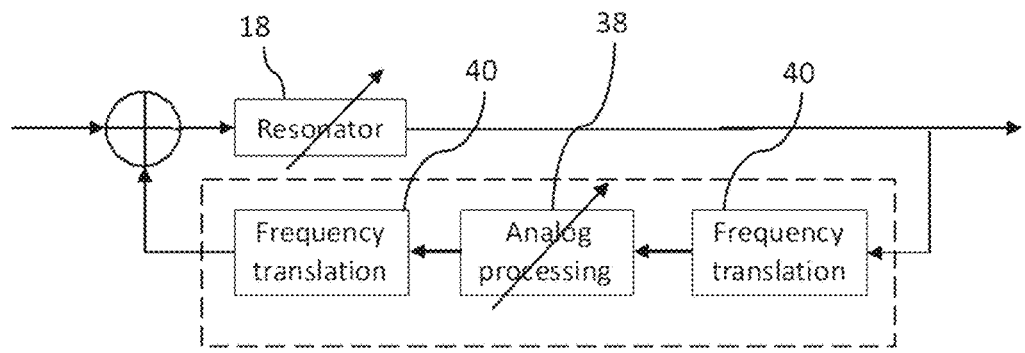
FIG. 14a is a schematic diagram of a single pole RF resonator processed with frequency in either analog processing.

The AMPP transformation from domain A to domain B may involve both frequency translation and signal digitization with DSP used for the feedback processing. As an example, FIG. 14a shows that the feedback processing may involve frequency translation 40 so that the actual feedback processing occurs at a different frequency that may result in a simpler and more practical realization of the feedback processing in an analog processing block 38.

Figure 14B:
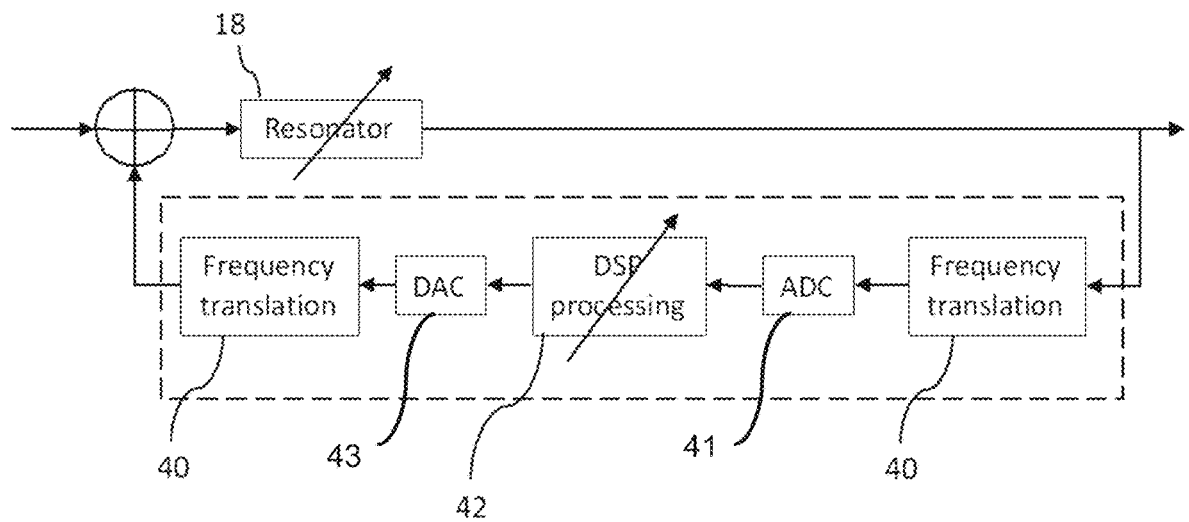
FIG. 14b is a schematic diagram of a single pole RF resonator processed with the AMPP DSP state space processing.

FIG. 14b illustrates a domain transformation that includes frequency translation 40 and both discrete time sampling in ADC block 41 and resulting quantization of the input signal. Feedback processing 22 may then be done in DSP processed state space in block 42 and converted to an analog signal in DAC block 43. The basic AMPP with frequency translation 40 may be incorporated into an SDR, as discussed below.

AMPP Implementations

Variable Delay Active Feedback Filter Tuning

Figure 15:
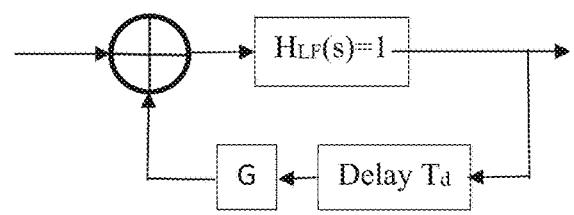
FIG. 15 is a schematic diagram of an AMPP filter representation showing delay in the feedback path.

A relatively simple example of a continuous time APP 10 implementation in state space is shown in FIG. 15. The AFF circuit was discussed and presented in FIG. 1.

The loop filter may be a bypass such that $H_{LF}(s)=1$. There is a variable delay of $T_d$ with a gain of G. There may be a simple AMPP, based on a single pole resonator, that may provide an arbitrary continuously variable delay in DSP that may be modelled as an infinite series of poles plus a gain factor such that arbitrary tuning may result.

Figure 16:
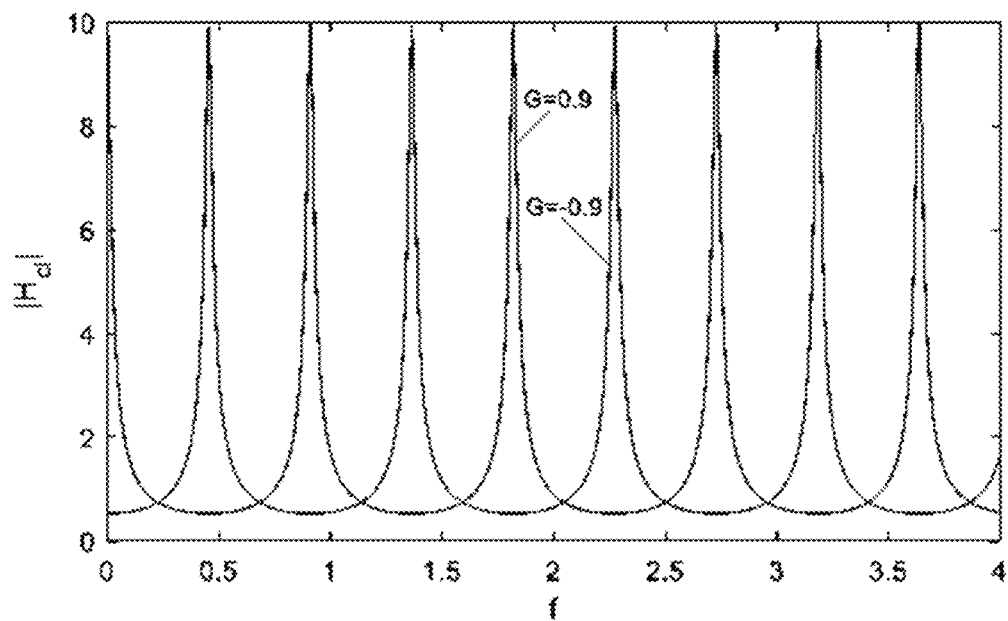
FIG. 16 is a plot of the frequency response of an APP with a time delay versus normalized frequency.

The open loop response evaluated on the jω axis is $$H_{ol}(s) = e^{-j\omega T_d}$$

such that the Nyquist resonance curve (NRC) is a closed circuit of unit radius. The operating point is on the real axis at 1/G such that if G>1 then the operating point will be encircled and the APP is unstable. For the range of G>−1 to G<1 there is Q enhancement of the set of frequencies where $\omega T_d = n\pi$ where n= . . . −2, −1, 0, 1, 2, . . . . Hence there may be a periodic frequency response with multiple Q enhanced poles and multiple passbands. This is shown in FIG. 16 for a delay of $T_d=1.1$.

Figure 17:
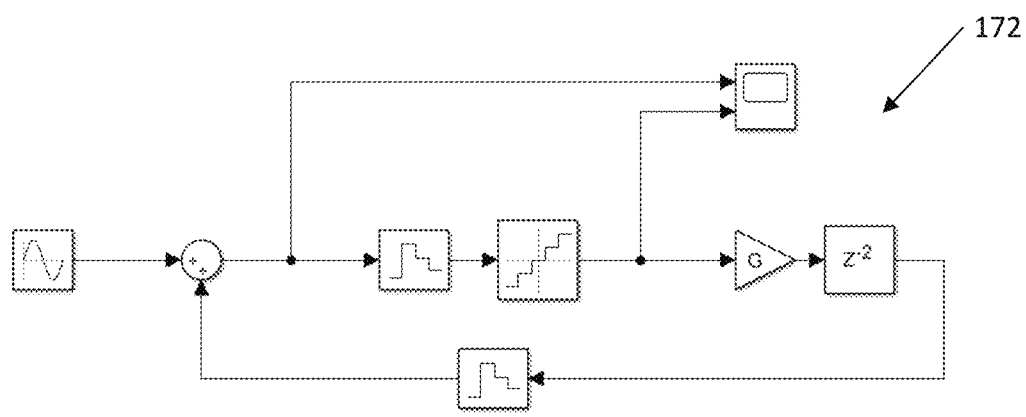
FIG. 17 is a schematic diagram of an AMPP with variable time delay.

Next consider a AMPP where the sampling interval is T and the delay is $T_d=nT$. Referring to FIG. 17, a Simulink™ model 172 is shown that uses an AMPP loop with a sum block for the feedback, and a quantizer that samples in time with a sampling interval of T. The samples are subjected to a delay which in this case is 2 sampling intervals by $z^{-2}$, where a DAC may be another zero-order hold.

Figure 18:
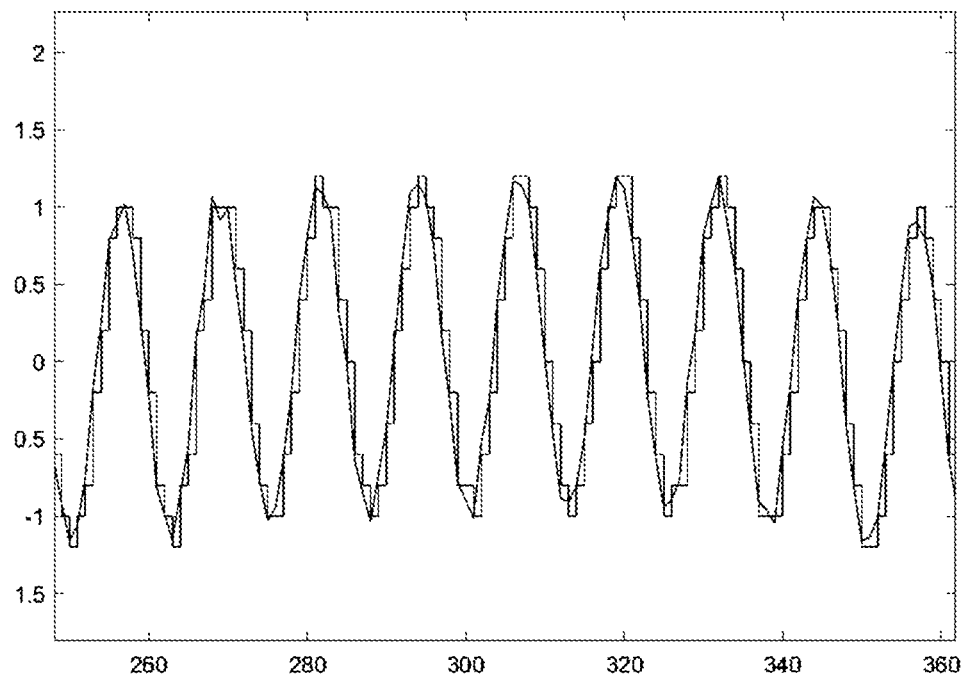
FIG. 18 is a plot of the response of an AMPP with variable delay to a sinusoidal input.

FIG. 18 shows a portion of the analog and digital quantized signal. Difficulties with time domain simulation involve the small amount of transient of multiple frequencies as the source is turned on at t=0, generating several frequency components. The transient takes a long time to die out as the delay AMPP Q enhances multiple frequencies.

The method of analysis is to convert the loop components into Z domain and to approximate the quantization as an independent noise source added at the point of the ADC conversion.

As in the continuous domain there may be an open loop response of $$H_{ol}(z) = z^{-2}$$

Instead of evaluating on the s=jω axis as in the s-plane the unit circle of $z = e^{j\omega T}$ may be evaluated in the Z plane. Hence the NRC is a unit circle and the Nyquist stability analysis may be considered as before. In this case there is no continuous time transfer function in the loop and hence the entire loop may be disregarded as sampled such that the closed loop response is $$H_{CL}(z) = \frac{1}{1-Gz^{-2}} = \frac{1}{1-Ge^{-2j\omega T}}$$

Figure 19:
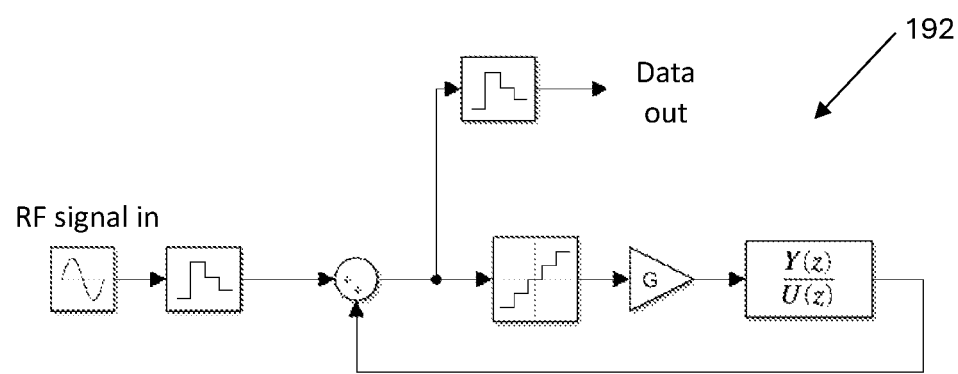
FIG. 19 is a schematic diagram of an equivalent Simulink™ AMPP model for loop analysis.

Note the comparison of the continuous time closed loop response of $$H_{CL}(j\omega) = \frac{1}{1-Ge^{-j\omega T_d}}$$

which is equivalent provided that $2T=T_d$. The difference is that the closed loop response assumes a time sampled signal. Hence the equivalent AMPP model 192 is shown in FIG. 19.

Figure 20:
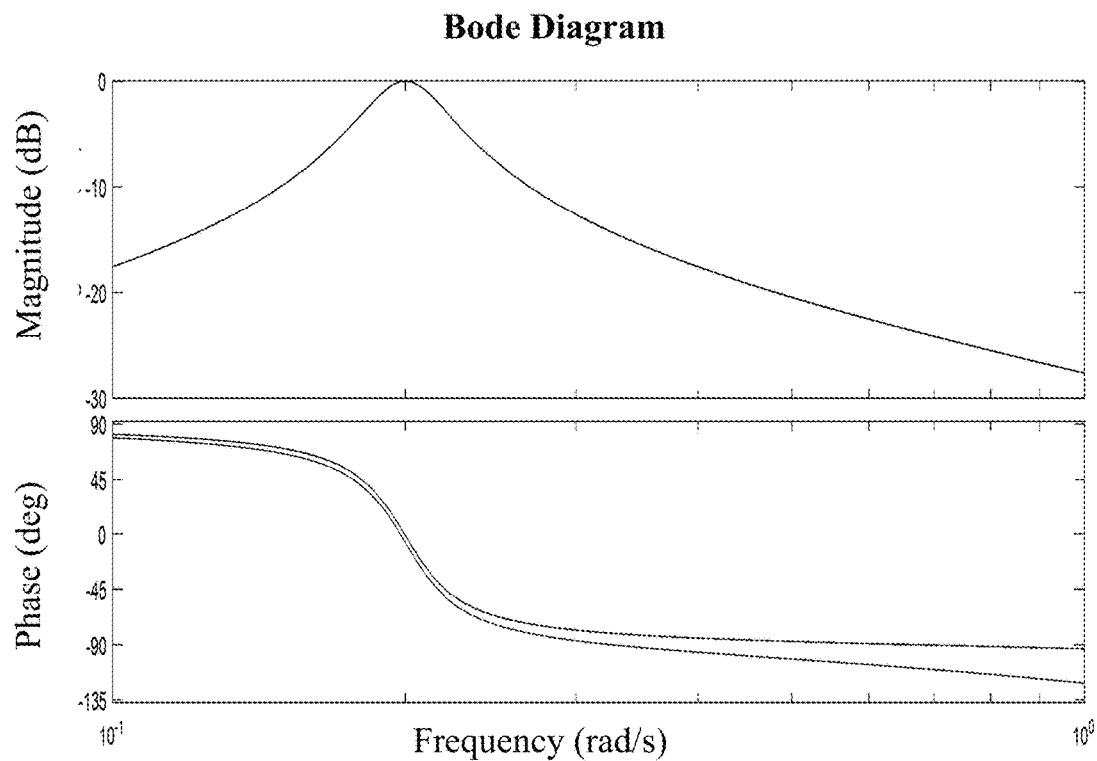
FIG. 20 is a plot of a bode plot comparison of the continuous and the discrete.

The AMPP considered may have a delay that is an integer number of sampling intervals, which is preferably variable. One possibility is to implement a delay with a passband response with $w_o=0.2$ (normalized);
$D=0.1$;
$T_d=0.1$;
$T=1.0$;

A bode plot of continuous and discrete responses is shown in FIG. 20. The discrete is calculated from the continuous based on an invariance of the step response when the ZOH (zero order hold) approximation is applied to the sampling operation. The responses are indistinguishable in magnitude and a small phase difference.

Figure 21:
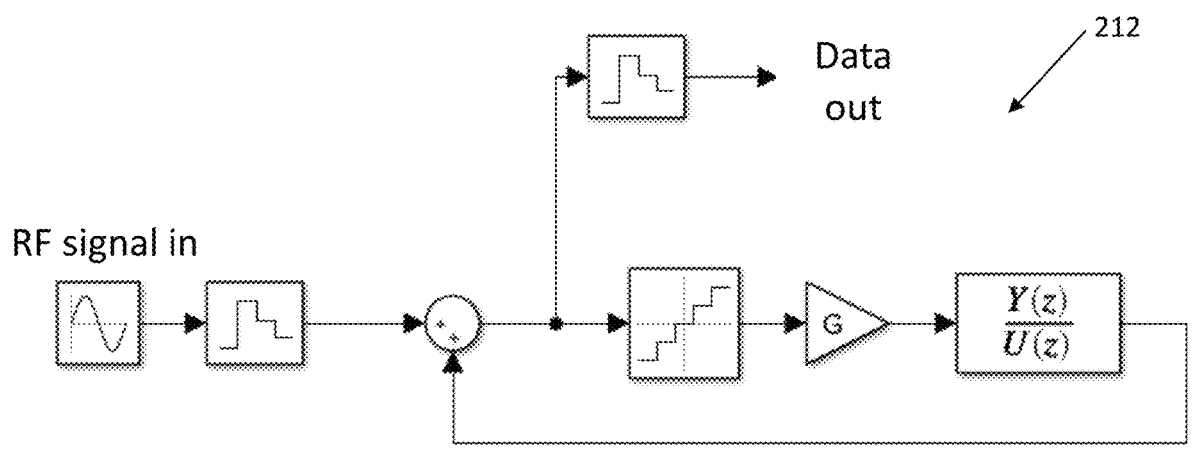
FIG. 21 is a schematic diagram of an AMPP with a bandpass phase shifter.
Figure 22:
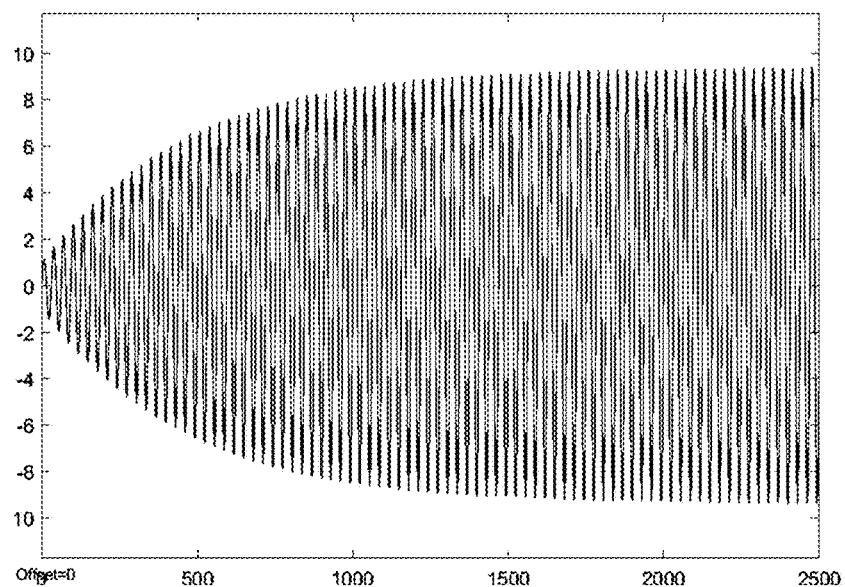
FIG. 22 is a plot of the response of AMPP with the sinusoidal signal applied.

A Simulink™ simulation model 212 of the discrete filter placed in the loop is shown in FIG. 21. G is 0.9 and hence a Q enhancement of about 10, which is revealed as the sinusoidal frequency of the input is at 0.2 rad/sec and an amplitude of 1. The model's response is seen in FIG. 22, with the horizontal axis in terms of DSP clock cycles, shows that the startup transient is stable and corresponds to the risetime constant, commensurate with the pole Q being implemented. There is a slight loss due to the ZOH of the 'sin(x)/x' frequency response.

With the transfer function of $H_d(z)$ given as $$Hd(z) = \frac{4.959 \times 10^{-5} z^3 - 4.991 \times 10^{-5} z^2 - 4.8.93 \times 10^{-5} z + 4.926 \times 10^{-5}}{z^4 - 3.96 z^3 + 5.901 z^2 - 3921 z + 0.9802}$$

the difference equation may be determined directly. It may be shown that the implementation in DSP involves 5 coefficient multiplications and 5 additions.

Single Pole (P=1) Variable Delay Discrete Time AMPP

Figure 23:
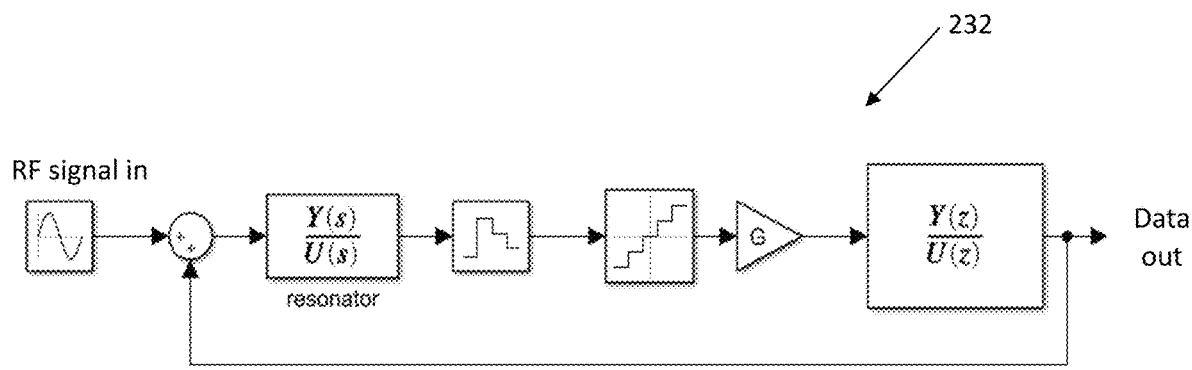
FIG. 23 is a schematic diagram of a single pole continuous time AMPP resonator Simulink™ model.

In this example, a single continuous time pole (P=1) resonator is considered as the Simulink™ model 232 depicted in FIG. 23, starting with a simple gain block.

Figure 24:
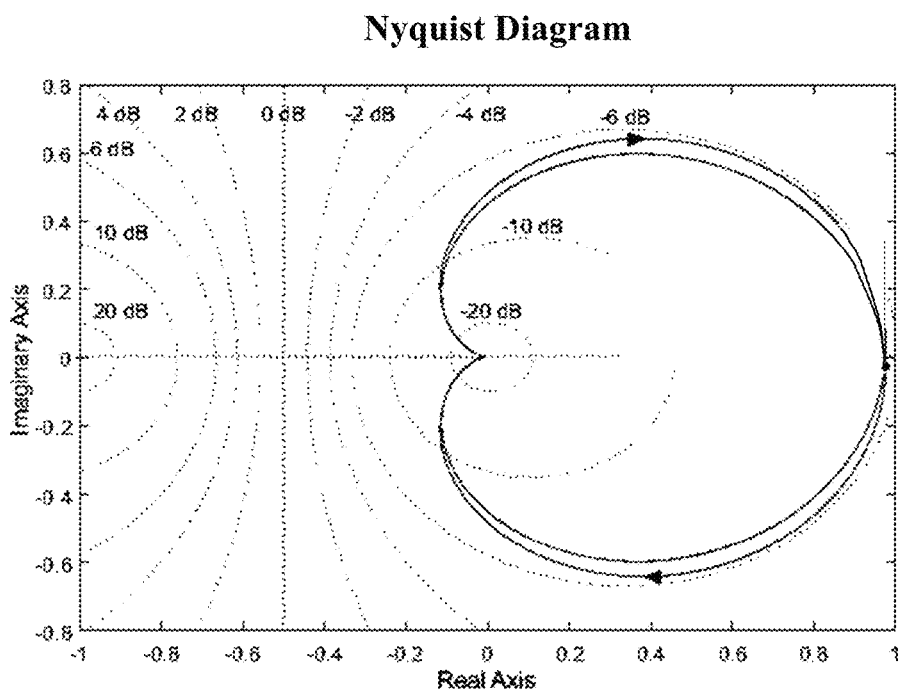
FIG. 24 is a plot of an open loop Nyquist (NRC) of a single pole AMPP resonator.

The open loop Nyquist plot is calculated based on converting the resonator into a discrete time sampled transfer function and then cascading this with the discrete time transfer function. The resulting NRC curve is shown in FIG. 24.

This two pole AMPP resonator Nyquist resonator curve (NRC) looks similar to a 2-pole frequency space resonator NRC because there are effectively two poles in this AMPP state space resonator: one as a continuous time resonator and the other as a digital domain resonator.

Clearly the continuous time resonator may be tuned and then the DSP resonator/phase shifter may be determined to provide a desired Q enhanced response.

Two Pole (P=2) Variable Delay Discrete Time AMPP

Figure 25:
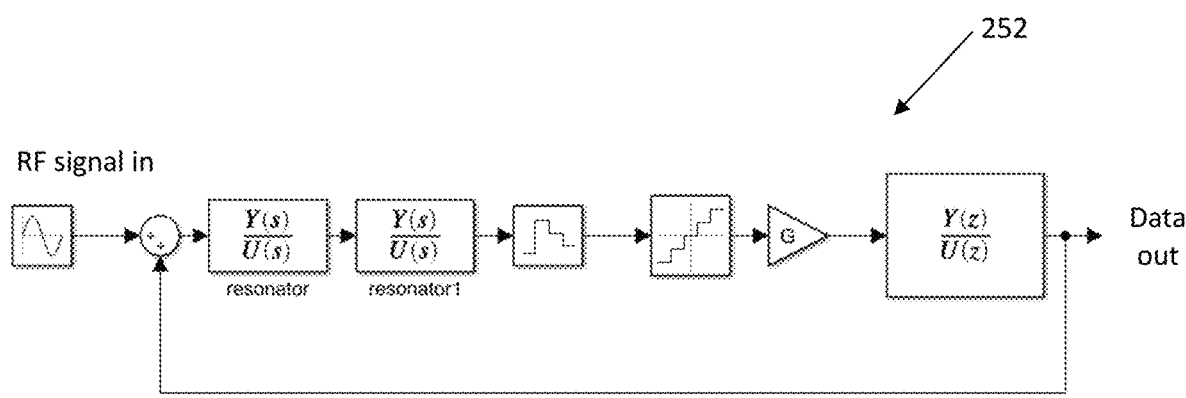
FIG. 25 is a plot of a two pole (P=2) continuous time AMPP resonator Simulink™ model.
Figure 26:
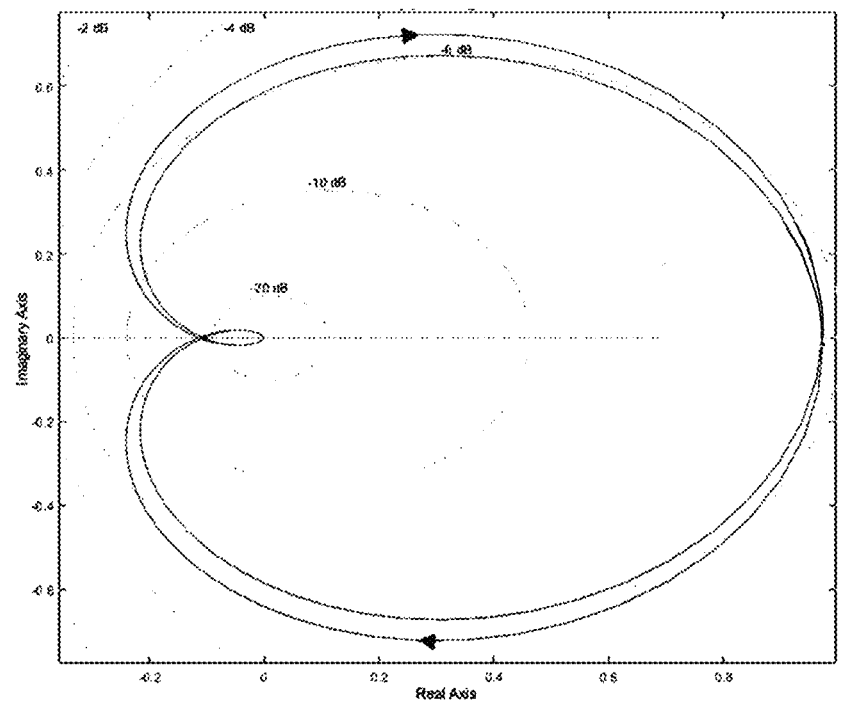
FIG. 26 is a plot of a Nyquist resonator curve of the two pole (P=2) AMPP.

We can also add a second resonator, as shown in the Simulink™ model 252 of FIG. 25. The open loop Nyquist plot is calculated based on first converting the continuous time resonator into a discrete time sampled transfer function, as above, and then cascading this with the discrete time transfer function. The resulting NRC for this P=2 AMPP is seen in FIG. 26.

State-Space AMPP of a Single Pole Resonator

We now consider the state space formulation of the AMPP feedback processing for a single pole resonator. Then this is expanded to the multi-pole resonator.

Start with the ideal single resonator that has a transfer function of $$H(s) = \frac{as}{s^2 + bs + c}$$

The general state space formulation is $$\frac{dx}{dt} = Ax + Bu$$

where x is the vector of state variables and u is the input. A is the system matrix and B is the input matrix. Let z(t) be the input and y(t) be the output. The state vector is selected to be $$x = \begin{bmatrix} x_1 \\ x_2 \end{bmatrix} = \begin{bmatrix} y \\ \frac{dy}{dt} \end{bmatrix}$$

which results in the system matrix of $$A = \begin{bmatrix} 0 & 1 \\ -c & -b \end{bmatrix}$$

Figure 27:
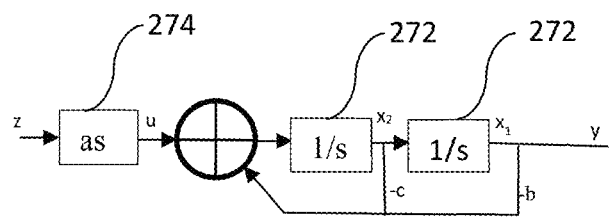
FIG. 27 is a schematic diagram depicting a state space model of a single pole resonator as a pair of integrators.

Note that the state variables selected are not unique and that different system matrices may result. However, the system modes are invariant to the choice of the state variables. The choice of state variables allows for a simple signal flow diagram consisting of a pair of integrators 272 as in FIG. 27.

For simplicity, the derivative operator in the numerator of H(s) is separated out and u(t) is taken as the input. Then the input matrix is $$B = \begin{bmatrix} 0 \\ 1 \end{bmatrix}$$

For the system to be controllable the controllability matrix of [B AB A²B ...] is determined, which must be of full rank. In this case it is as $$[B \; AB] = \begin{bmatrix} 0 & 1 \\ 1 & -b \end{bmatrix}$$

The system is controllable and hence the pole may be fully moved with feedback based on a linear superposition of the two state variables. However, there is only access to the state variable $x_1$. In this simple example we have $x_2 = \dot{x}_1$. Therefore, if $x_1$ is observed then $x_2$ may be derived by a linear operation. Therefore, a full state feedback may be provided, and then as the resonator is controllable, place the closed loop poles at an arbitrary desired location. For a higher order system, this may not be so obvious that all the state variables may be observed from the single output. A method of determining if this is possible is to consider the observability of the system. If the state space system is observable, then all the state variables may be derived by linear operations and superpositions of the available outputs. The output of the state space is represented as $$y = Cx + Du$$

where in this case $x_1$ is observed at the output such that C=[1 0]. The observability matrix is $$\begin{bmatrix} C \\ CA \\ CA^2 \end{bmatrix}$$

which must be of full rank. In this case the observability matrix is $$\begin{bmatrix} 1 & 0 \\ 0 & 1 \end{bmatrix}$$

which has a rank of 2.

Next, the weighting vector for the feedback may be formed, denoted as k and the input is then $$u_f = -kx$$

Therefore, the state space of the closed loop AFF is $$\frac{dx}{dt} = (A - Bk)x + Bu$$

The new closed loop poles are given as the eigen values of the matrix (A−Bk). Hence the weight or control law vector of k may be determined, which will set the desired poles. That is, if the pair of {A,B} is controllable, then the eigenvalues of (A−Bk) may be any arbitrary desired set.

As we have separated out the derivative operator from the numerator, we would like to add the feedback to the input so that we must adjust the feedback by (1/as) implying an integration, giving $$F(s) = \frac{k_1 + k_2 s}{as}$$

and the feedback is $F(s)X_1(s)$. If $\omega_r$ is adjusted, then $k_1$ may become zero. Hence what is left is that the feedback to the input is proportional to $x_1(t)$.

The state space formulation is therefore a powerful tool in considering any form of resonator and positing an existence query as to whether all of the poles of a multi-pole resonator may be individually Q modified (enhanced or spoiled) to desired locations in the s plane.

Note also that the resonator $\omega_r$ may not need to be adjusted for the desired closed loop pole: it may be sufficient to adjust k. As will be shown, it may be possible to adjust $\omega_r$ after determining k such that the magnitude of k may be minimized Or it may be possible to set coefficients in k to zero by changing $\omega_r$. This is beneficial as the processing to determine the state variables may then be simplified as some are weighted by zero in the feedback.

With switched fixed capacitors for frequency tuning, it is not possible to smoothly tune the capacitor in state space. Hence, the state variables may be approximated from the output. With the controller version of the state space this is straightforward as $x_2 = (dx_1)/dt$. Consequently, the feedback is:

$$f = k_1 x_1 + k_2 x_2 = k_1 x_{1,k} + \frac{k_2}{T}(x_{1,k} - x_{1,k-1})$$

Figure 28:
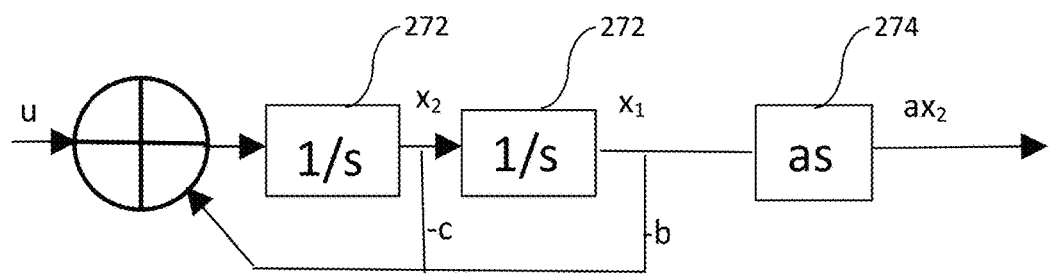
FIG. 28 is a schematic diagram depicting a state space single pole model revised to change the order of the processing.

It may be better to change the order of the processing such that the derivative $x_2$ is after the state space processing in block 274 with a numerator of one in order to have an estimate of $x_2$ that may be scaled and integrated to form the feedback required for a Q enhanced resonator that is then adjusted in frequency such that $k_1=0$. This reversal in state space is shown in FIG. 28.

The optimal determination of the weighting vector of k is based on A and B. A caution is that the state variables are now based on this modified transfer function. Note that assuming the numerator derivative to be in front changes B, and hence changes the weighting vector k as well as the state variables. This may be compensated for in the AMPP feedback processor.

Figure 29:
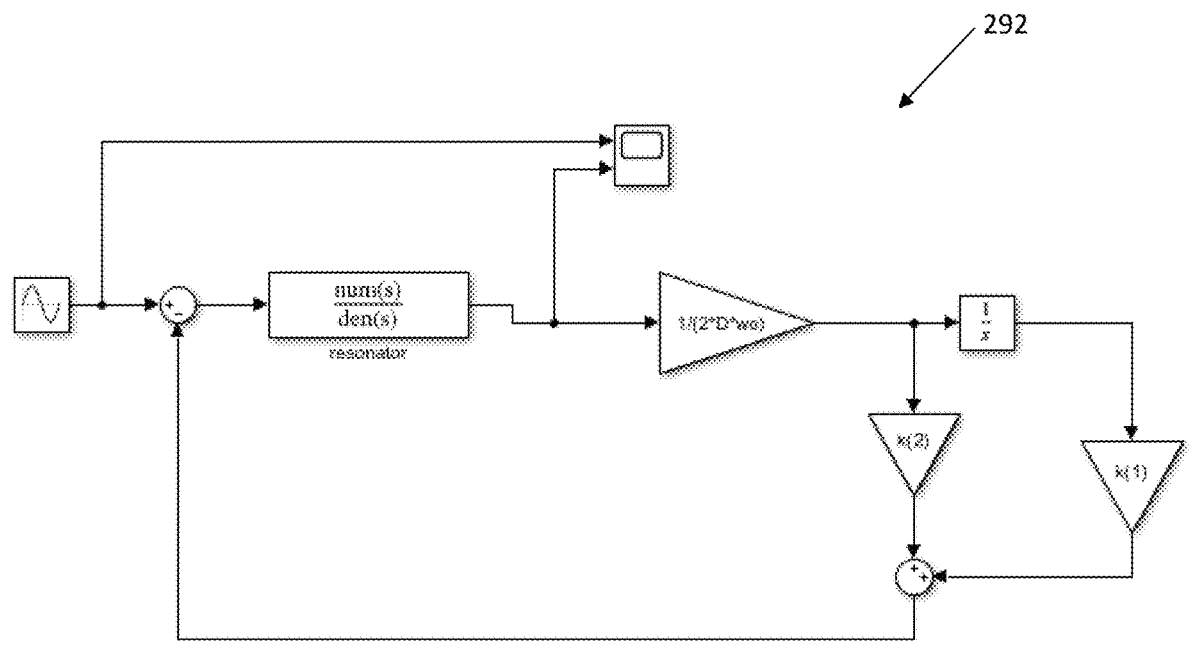
FIG. 29 is a schematic diagram of a Simulink™ model of a single pole Q enhanced resonator.
Figure 30:
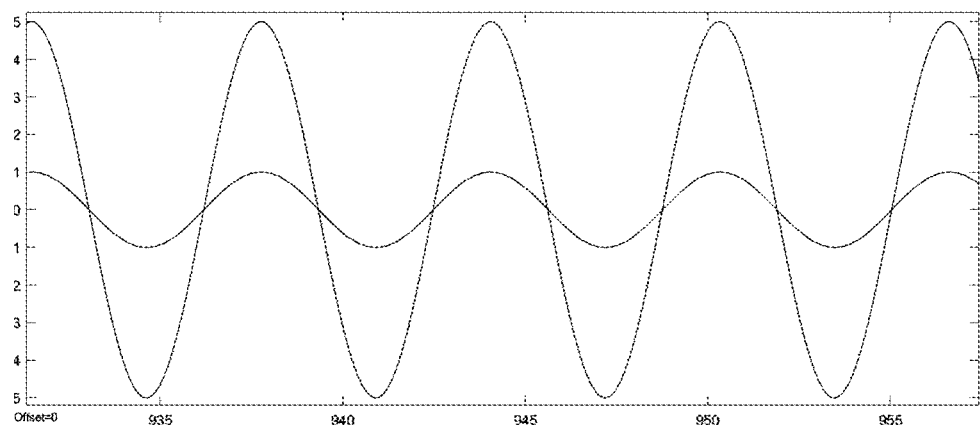
FIG. 30 is a plot of a simulation of the input signal from FIG. 29.

FIG. 29 is a model 292 of the state space Q enhanced single pole resonator with state space feedback showing that the DSP, consisting of 3 gain blocks, an integrator, and a summer, may be used to determine the effect of active feedback in a single pole RF resonator in frequency space. These operations may be mapped into a discrete time DSP formulation. FIG. 30 shows the simulation response.

Figure 31:
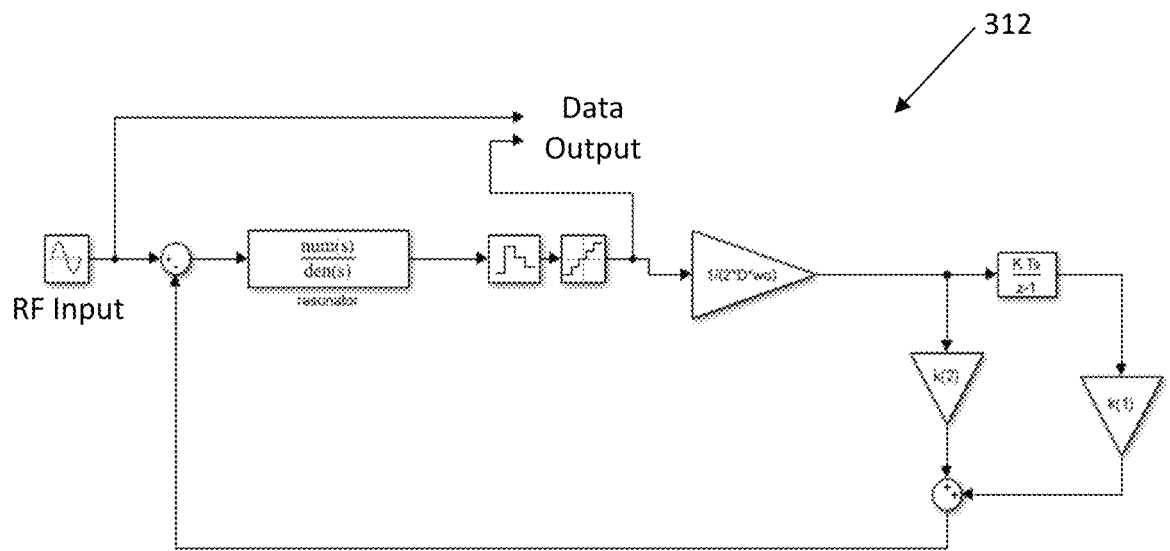
FIG. 31 is a schematic diagram of a Simulink™ model of a Q enhanced resonator in discrete time sampled form.
Figure 32:
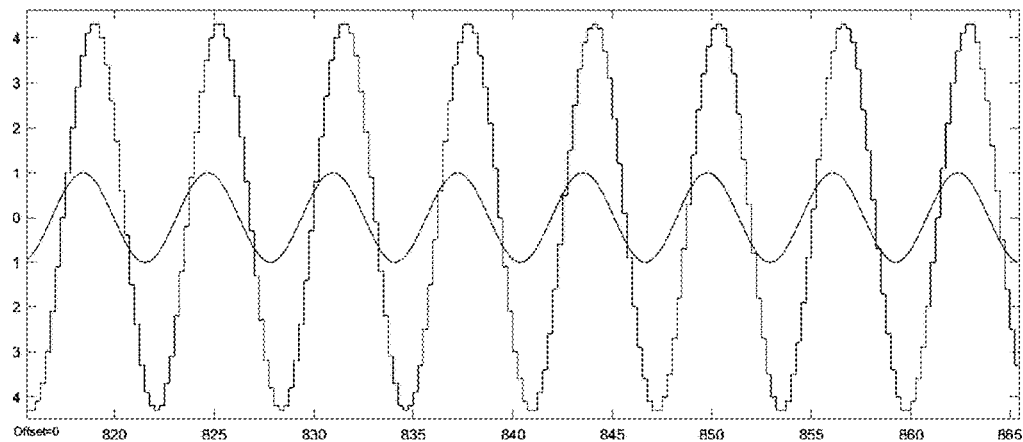
FIG. 32 is a plot of the simulation output of the signal in and the quantized AMPP signal.

DSP processing may be added as shown in the model 312 of FIG. 31 and show similar Q enhancement as in FIG. 32 where the horizontal axis is seconds. Note though that the results are a little off due to the delay in the integrator which is represented by the discrete time accumulator. Note further the time phase lag of the quantized resonator output relative to the input. The quantization step was 0.1 and the time resolution was 0.25. FIG. 32 shows the simulation response.

While this is a demonstration that the DSP processing is both efficient and simple to implement, the conversion from continuous time to discrete time may not be the best approach. Alternatively, the resonator may be modelled in Z domain, which may result in a more direct DSP implementation.

AMPP Implementations in the Z Domain

Single Pole AMPP Resonator Response Modelled in the Z Domain

In this example, the first step is to create the continuous time model of the resonator that is subsequently converted to a discrete time model as was discussed above and modelled and shown in FIG. 23. It can be shown that this results in a Z-transform model as:

$$H(z) = \frac{b_1 z + b_2}{z^2 + a_1 z + a_2}$$

Assume $u_k$ is the input and partition the model into the denominator part and the numerator part.

$$H(z) = \frac{1}{z + a_1 + a_2 z^{-1}}(b_1 + b_2 z^{-1})$$

Let $y_k$ be the output of the first transfer function and define the state variables as $$x_{1,k} = x_{2,k-1}$$

$$x_{2,k} = y_k$$

This then sets up the state space of A and B where $v_k$ is the output.

Next decide on the Q enhanced poles and determine the k vector. The feedback is given by $$f_k = -k_1 x_{1,k} - k_2 x_{2,k} = -k_1 x_{2,k-1} - k_2 x_{2,k}$$

We have the output observable as $v_k$ which is related to the state variable as:

$$v_k = b_1 y_k + b_2 y_{k-1}$$

which is expressed in terms of the state variables as:

$$v_k = b_1 x_{2,k} + b_2 x_{2,k-1}$$

From which $$x_{2,k} = -\frac{b_2}{b_1} x_{2,k-1} + \frac{1}{b_1} v_k$$

Figure 33:
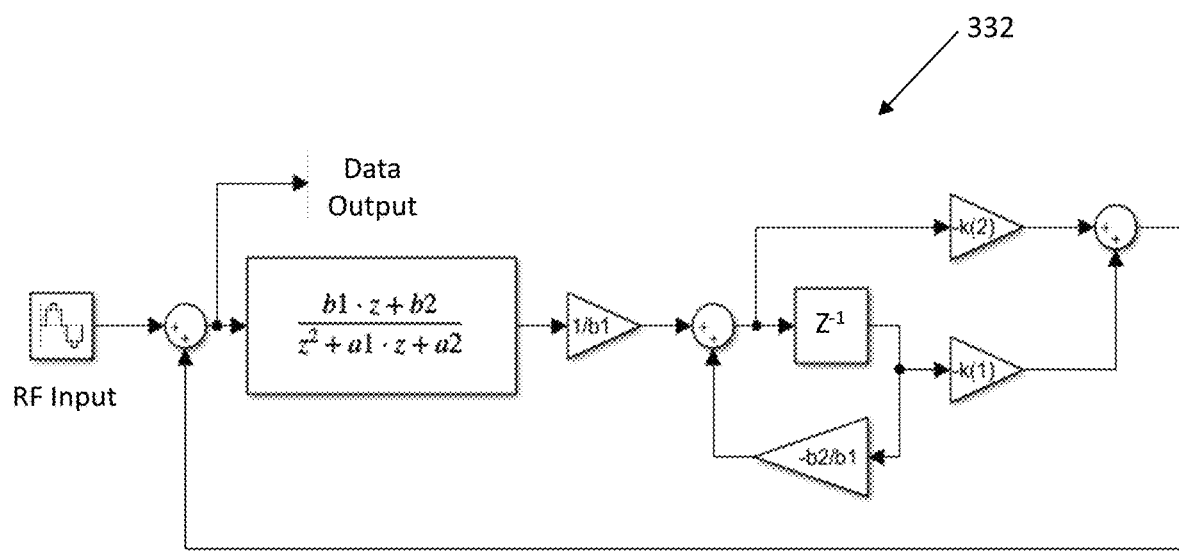
FIG. 33 is a schematic diagram of a Simulink™ model of a single Q enhanced pole.

An advantage of the controller state space model is that the state variables are direct delayed versions. Hence a simple delay tapped line is implemented. This is shown in the Simulink™ model 332 of FIG. 33 As this is only a single pole, only one delay is needed. Note the operations required are four multiplies and two sums.

Two Pole Resonator AMPP Response Modelled in the Z domain

Next consider the AMPP with two resonators. The same steps as before may be followed to determine the DSP processing that is required. The first step is the continuous time model of the resonator, followed by conversion to a discrete time model. This two pole resonator was previously discussed and modelled as previously shown in FIG. 25.

It can be shown that this results in a z-transform model as $$H(z) = \frac{\Sigma_{i=0}^{3} b_{4-i} z^i}{\Sigma_{j=0}^{4} a_{5-j} z^j}$$

The coefficient of $a_1$ is always 1 this may be pulled out, rewriting the transfer function as $$H(z) = \frac{\Sigma_{i=0}^{3} b_{4-i} z^i}{z^4 + \Sigma_{j=0}^{3} a_{5-j} z^j}$$

Now multiply by $z^{-3}$ to get $$H(z) = \frac{\Sigma_{i=0}^{3} b_{4-i} z^{i-3}}{z + \Sigma_{j=0}^{3} a_{5-j} z^{j-3}}$$

Assume $u_k$ is the input and then partition the model into the denominator part and the numerator part as $$H(z) = \left(\frac{1}{z + \Sigma_{j=0}^{3} a_{5-j} z^{j-3}}\right)\left(\sum_{i=0}^{3} b_{4-i} z^{i-3}\right)$$

Let $y_k$ be the output of the first transfer function and define the state variables as $$x_{1,k} = x_{2,k-1}$$

$$x_{2,k} = x_{3,k-1}$$

$$x_{3,k} = x_{4,k-1}$$

$$x_{4,k} = y_k$$

This then sets up the state space of A and B, where $v_k$ is the output. Next decide on the Q enhanced poles and determine the k vector. It can be shown that the feedback is thus given by $$f_k = -\sum_{i=1}^{4} k_i x_{i,k} = -\sum_{i=1}^{4} k_i x_{4,k-i}$$

We have the output observable as $v_k$ which is related to the state variable as:

$$v_k = \sum_{i=1}^{4} b_i y_{k-i+1}$$

which is expressed in terms of the state variables as $$v_k = \sum_{i=1}^{4} b_i x_{4-i+1,k}$$

from which $$x_{4,k} = \frac{1}{b_1} v_k - \frac{1}{b_1} \sum_{i=2}^{4} b_i x_{4-i+1,k} = \frac{1}{b_1} v_k - \frac{1}{b_1} \sum_{i=2}^{4} b_i x_{4,k-i+1}$$

Figure 34:
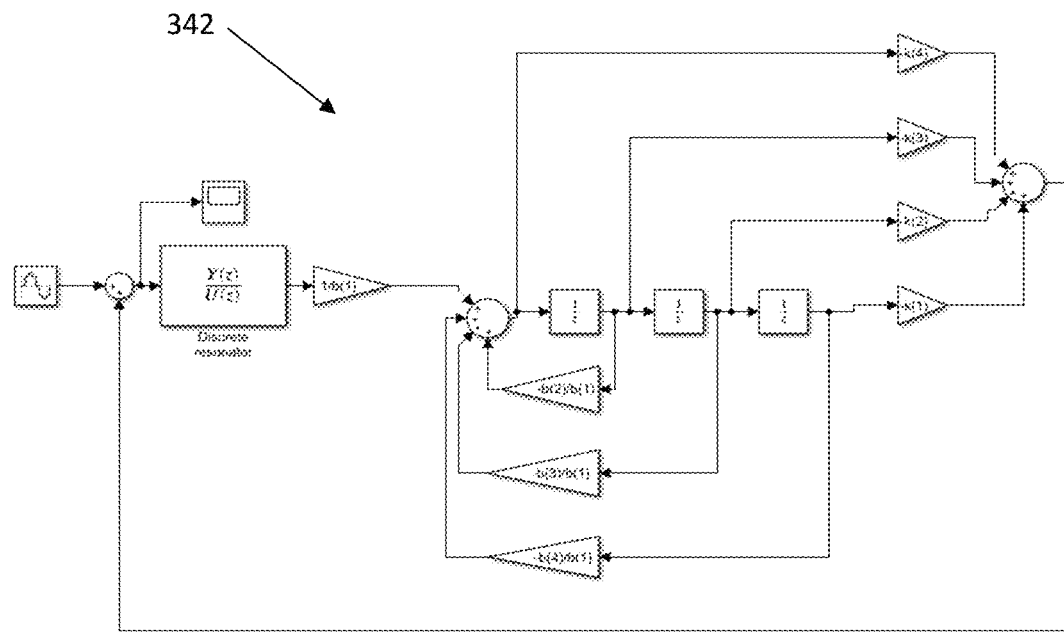
FIG. 34 is a schematic diagram of a Simulink™ model of a Q enhanced 2 pole AMPP.

The advantage of the controller state space model is that the state variables are all direct delayed versions. Hence a simple delay tapped line is implemented. This is shown in the Simulink™ model 342 of FIG. 34. As this is only a single pole, only one delay is needed, and the DSP becomes an easily implemented simple filter structure. Note the operations required are four multiplies and two sums. As shown, the processing block may include multiple feedback and feedforward paths.

Figure 35:
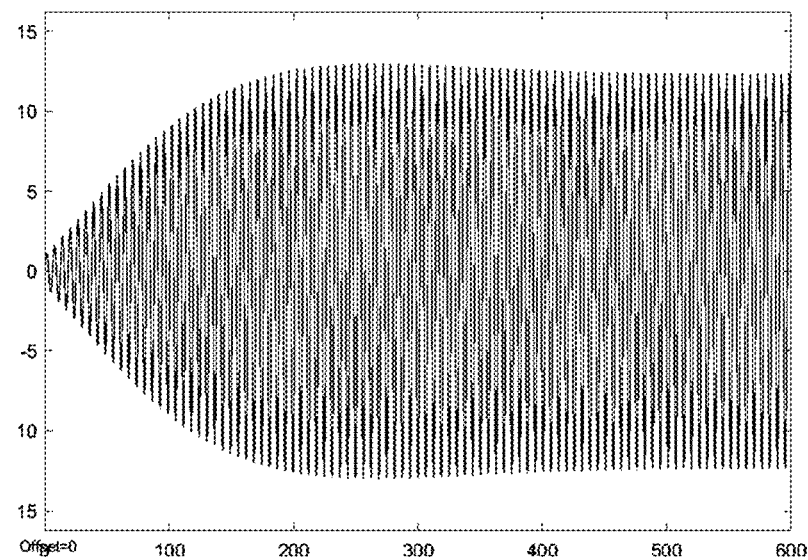
FIG. 35 is a plot of the simulation output of the 2-pole AMPP resonator where the 2 poles are placed simultaneously.

FIG. 35 shows the simulated output of this 2-pole AMPP resonator where the two poles are placed simultaneously. The horizontal axis is in terms of DSP clock cycles and shows that the start-up transient is stable and corresponds to the risetime constant commensurate with the pole Q being implemented.

Generating a Third Order Chebyshev/Butterworth Response Using AMPP

Figure 36:
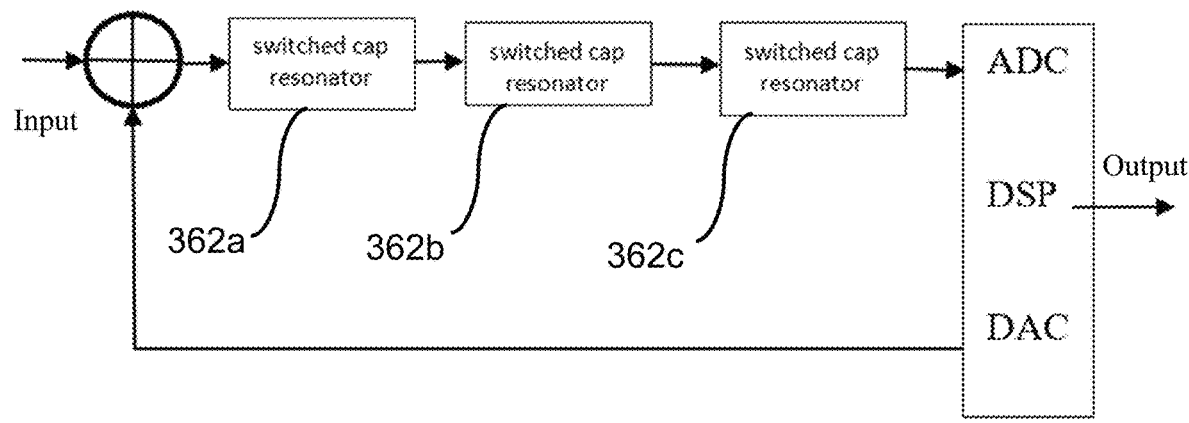
FIG. 36 is a schematic diagram of a third order RF Chebyshev bandpass filter implementation using AMPP processing on resonators using a fixed capacitor value.

As a final example consider the practical implementation of a tunable multi-pole filter as shown in FIG. 36. The three resonators 362a, 362b, 362c are set up with fixed capacitors required for the frequency that is closest to the center frequency of the objective Q enhanced filter.

An AMPP pole placement algorithm may then be used to determine the processing required to get the pole placement that approaches the desired passband response. In the Chebyshev case, the objective is a flat passband response over a desired −1 dB bandwidth. The resulting response is shown in FIG. 37 with phase on the left vertical axis, and magnitude on the right vertical axis.

Figure 38:
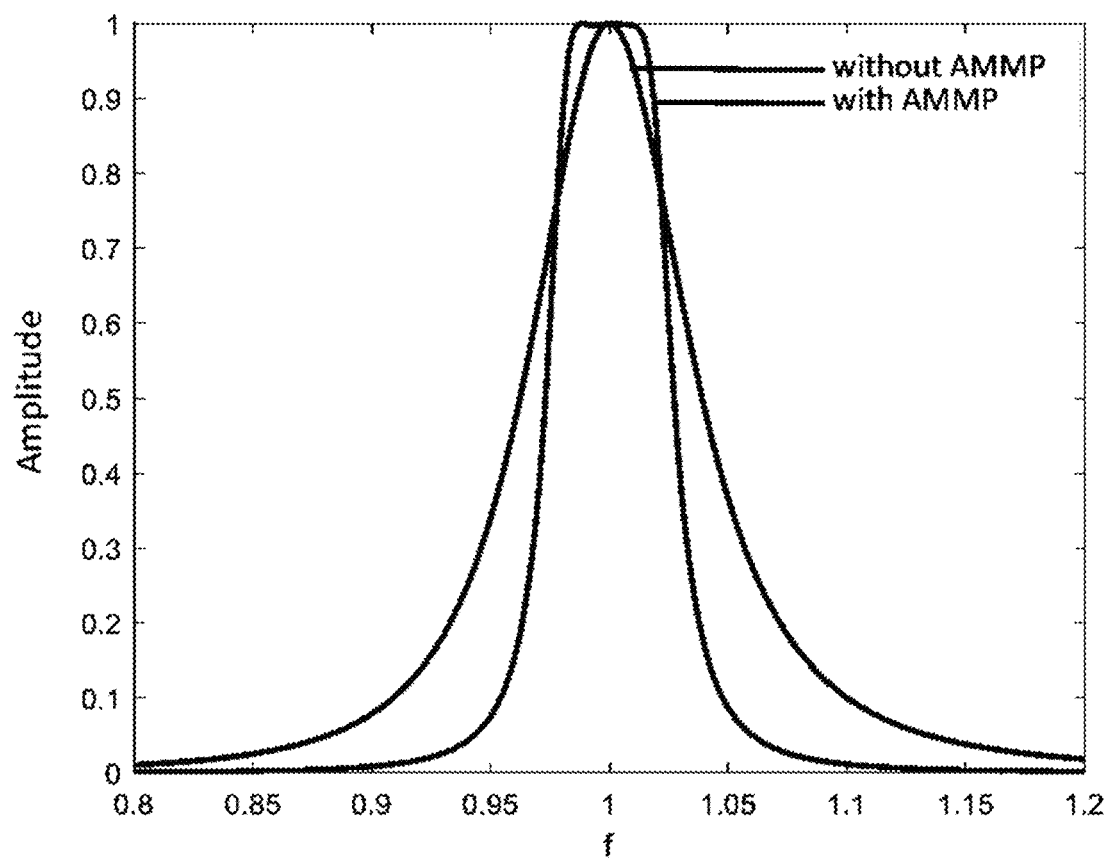
FIG. 38 is a plot of a normalized frequency response of a third order resonator before processing and after AMPP processing.

As another visualization of what the AMPP algorithm is doing for this Chebyshev bandpass filter example, consider FIG. 38. The blue curve is the response of the three resonators in FIG. 36 without any AMPP feedback. For this Chebyshev example, the normalized resonant frequencies of each resonator are set to 1 rad/sec, which is the pass band center of the desired response. The AMPP feedback then moves the three poles of the resonators in the s-plane such that the desired pass band response is obtained.

Figure 37:
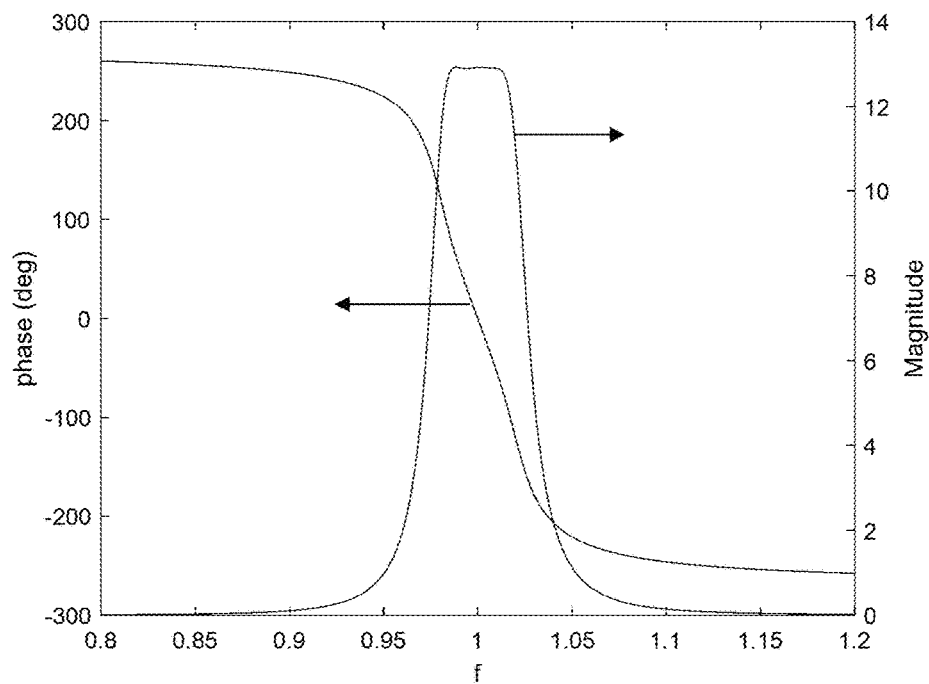
FIG. 37 is a plot of a normalized frequency response of a third order AMPP filter.

This response, as shown in FIG. 37, is copied to FIG. 38 and amplitude normalized for direct comparison of the two results. Similar methods may be used to achieve a Butterworth passband response.

Integrating AMPP into a Software Defined Radio (SDR)

One utility of the AMPP processing is direct frequency translation discussed above that may also be achieved in a DSP which additionally provides signal digitization using discrete time sampling and quantization discrete time sampling of the signal and subsequent reconstruction where the feedback processing may be precisely implemented.

Figure 39:
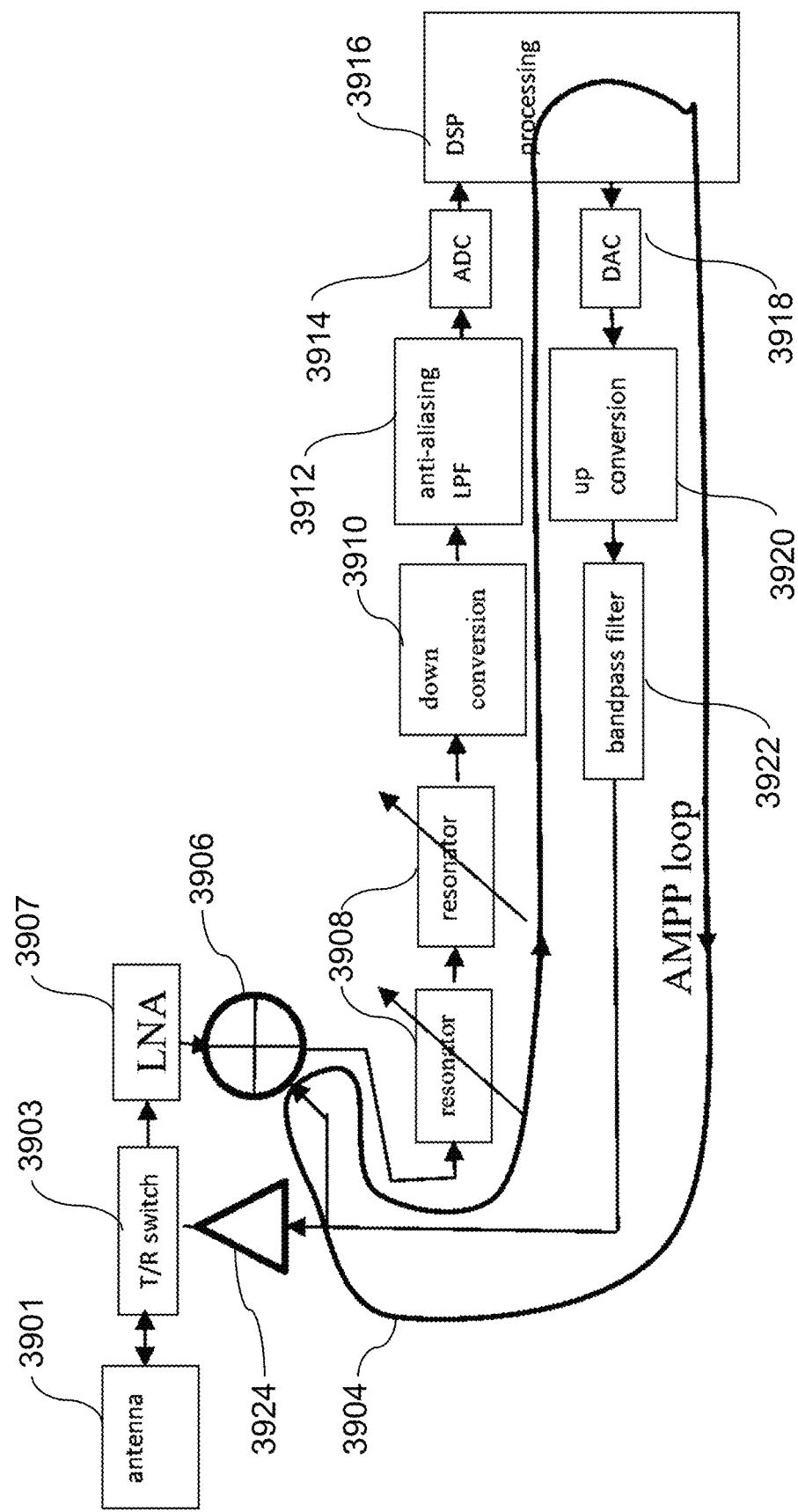
FIG. 39 is a schematic diagram of an AMPP in an SDR (software defined radio) context showing the transmit channel used as part of the AMPP feedback processing.

FIG. 39 shows a AMPP loop 3902 that receives a signal via an antenna 3901, transmit/receive switch 3903, and low noise amplifier (LNA) 3907 that consists of three partitions:

1) A forward path 3904 from the sum block 3906, through tunable resonators 3908, a down conversion block 3910, an anti-aliasing LPF (low pass filter) block 3912, and an ADC block 3914 to the DSP processing block 3916;
2) Feedback processing in DSP 3916;
3) A reverse path from DSP 3916 through a DAC block 3918, an up conversion block 3920, a bandpass filter 3922, gain block 3924, and back to the sum block 3906.

The forward signal path, digitization, and DSP may be existing components of a software defined radio (SDR). Hence the AMPP may be implemented in an SDR with conventional transmit and receive channels.

In FIG. 39, the antenna 3901 feeds into the T/R (transmit/receive) switch 3903 with the receive port going into the LNA 3907 and the AMPP forward path with a plurality of tunable bandpass resonators 3908. AMPP loop processing is completed in the DSP 3916, and the SDR feedback passes through the DAC 3918, up-conversion 3920 and then the summer 3906 as before.

In the standard SDR transmit mode, the DSP 3916 generates the transmit baseband signal with the DAC 3918 and up-conversion 3920, but now the signal is passed to the power amplifier T/R switch 3903 and to the antenna 3901. In this way there is little additional hardware required for the AMPP function. The bandpass filter 3922 after the up conversion is a broad bandwidth designed to remove some of the spurious DAC components such as the noise components of the DAC. However, this is hampered as the DAC 3918 is within the loop and contributes noise.

Figure 40:
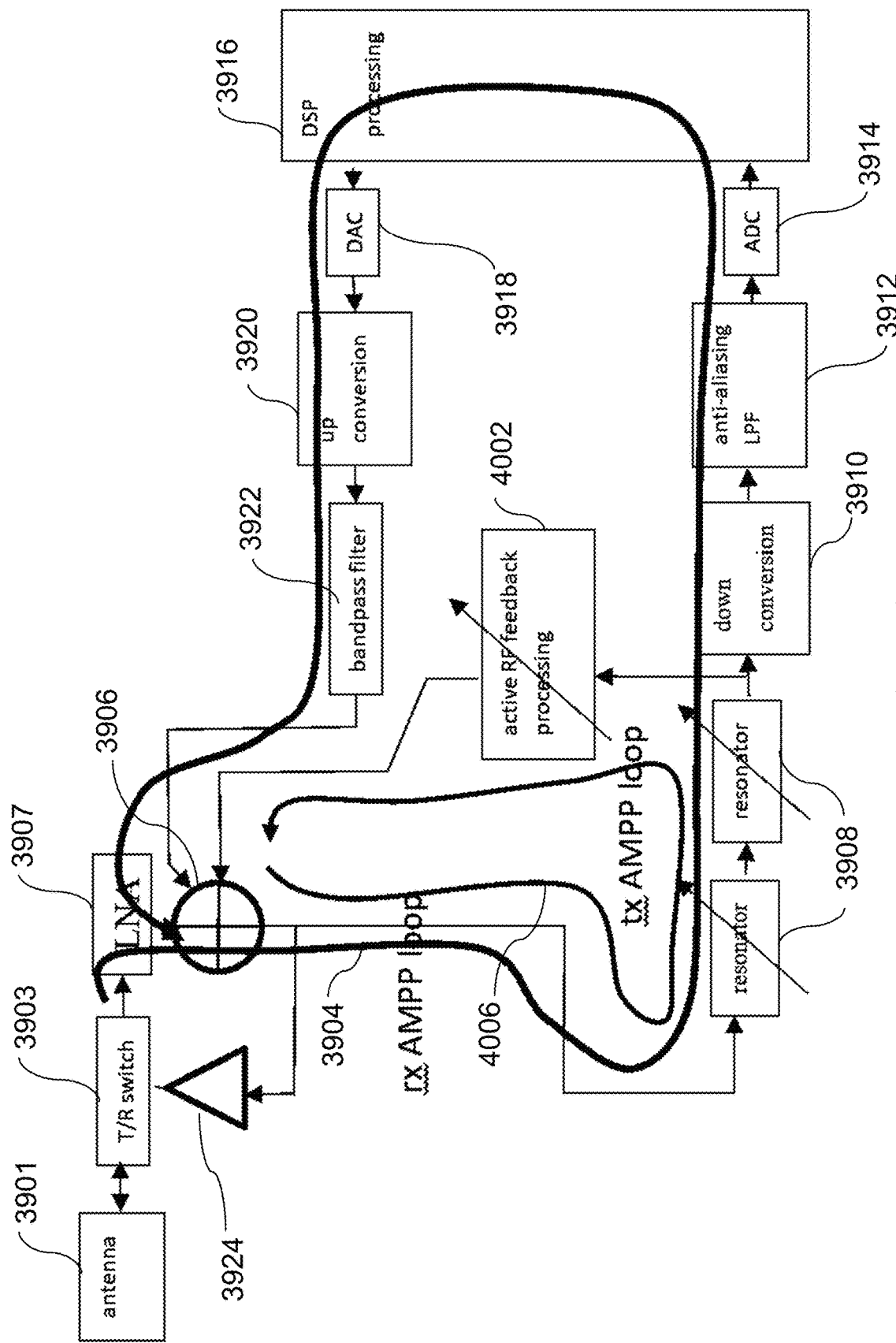
FIG. 40 is a schematic diagram of an AMPP applied in the transmit path and the receive path.

Referring to FIG. 40, an additional active RF feedback processing block 4002 may be required on a transmit AMPP loop 4006, which as shown in FIG. 40. Note that the transmit filtering may be achieved by adding a modest amount of additional hardware.

Many SDR options are relevant here. In a direct sampling SDR, no down conversion is required, frequency translation is optionally handled in DSP, and sub-sampling may be applicable.

As an example, three single-pole resonators may be provided with an active feedback signal loop with a variable gain block to form a bandpass filter in the RF domain. When the feedback gain is increased, the center pole of the three resonators moves toward the jω axis, while the flanking poles move a smaller amount away from the jω axis, thus creating Q-enhancement.

Inversely, if the feedback gain is reduced, the center pole of the three resonators moves away from the jω axis, while the flanking poles move a smaller amount toward the jω axis, thus creating Q-spoiling.

With the AMPP state space feedback, however, each of the three s-plane poles may be independently moved toward the jω axis simultaneously for Q-enhancement or away from the jω axis for Q-spoiling. As long as no single pole moves across the jω axis into the right hand s-plane from the left-hand plane, then this active feedback 3-pole BPF is always stable.

One could have the active feedback BPF enabled, and then disable this active feedback BPF path and enable the AMPP state space feedback path. Additionally, the apparatus may include both the active gain modifying feedback paths 4102 using resonator active feedback processing block 4104 and the AMPP state space feedback path 4106 using AMPP feedback processing block 4108 as shown in FIG. 41.

- Active gain feedback control is useful for modest Q enhancements where the resulting pole Q is modest.
- The AMPP feedback may include up-conversion for use with a slower rate DAC or may be at the signal frequency for a high sampling rate DAC.
- While AMPP is capable of Q enhancing all three poles simultaneously, latency in DSP processing may be introduced if the BPF bandwidth is too broad.

Referring to FIG. 42, a generalized AMPP is shown with a cascade of resonators 3908, which may allow more resonator poles to be Q enhanced. These may be Q enhanced for a two-pole bandpass filter between the input port and the ADC port. Alternately, the AMPP may be used to Q enhance all four resonators 3908 simultaneously for a four-pole bandpass filter.

State-Space Formulation of AMPP Feedback Processing

This section will consider a state space formulation of the AMPP feedback processing that will enable simultaneous placement of multiple poles. In the typical case the multi-pole resonator structure is implemented as a two-port subsystem with a single input and a single output, referred to herein as a Single Input Single Output (SISO) network. From the single output the AMPP processing makes sufficient observations to form the single feedback to Q enhance or place multiple poles at a time. While the single feedback is in principle sufficient to move the multiple poles to desired locations, a practical implementation of the AMPP will allow for the resonators to be adjusted simultaneously. This may reduce the amplitude of the required feedback signal. However, the resonator frequencies may not need to be tuned precisely or with high resolution. Hence switched capacitors may be used for the tunable resonator.

It is also possible to consider the general resonator with multiple input ports and multiple output ports or a MIMO (Multiple Input Multiple Output) network. However, as SISO works adequately for AMPP, there is little impetus for added complexity. However, MIMO may be considered for the AMPP in the most general form.

Consider the AMPP with N/2 resonators. Converting the resonator transfer function to the Z domain results in an Nth order transfer function as $$H_{res}(z) = \frac{\sum_{i=0}^{N} b_i z^{-i}}{\sum_{j=0}^{N} a_j z^{-j}}$$

The coefficient $b_0$ is zero as there is no through connection. Also $\alpha_j$ is always normalized to 1. The numerator and denominator are multiplied by z in preparation for the state space notation, giving $$H_{res}(z) = \frac{\sum_{i=1}^{N} b_i z^{-i}}{1 + \sum_{j=1}^{N} a_j z^{-j}} = \frac{\sum_{i=1}^{N} b_i z^{-i+1}}{z + \sum_{j=1}^{N} a_j z^{-j+1}}$$

Next consider this as a cascade of two transfer functions. The first is the all-poles section and the second is the numerator portion. The all-pole section given as $$H_A(z) = \frac{1}{z + \sum_{n=1}^{N} a_n z^{-n+1}}$$

results in a difference equation of $$y_{k+1} = -\sum_{n=1}^{N} a_n y_{k-n+1} + u_k$$

We have a set of state variables as $$x_{n,k} = y_{k-n+1}$$

such that $$x_{n+1,k+1} = x_{n,k}$$

Consequently, the difference equation may be written as $$x_{1,k+1} = -\sum_{n=1}^{N} a_n x_{n,k} + u_k$$

Hence the state space A matrix is given as $$A = \begin{bmatrix} -a_1 & -a_2 & & -a_N \\ 1 & & & \\ & 1 & & \\ & & 1 & \end{bmatrix}$$

And the B matrix is $$B = \begin{bmatrix} 1 \\ 0 \\ 0 \\ 0 \end{bmatrix}$$

The numerator transfer function is given as $$H_B(z) = \sum_{m=1}^{N} b_m z^{-m+1}$$

Write the difference equation as $$v_k = \sum_{m=1}^{N} b_m y_{k-m+1}$$

Therefore $$y_k = \frac{1}{b_1} v_k - \sum_{m=2}^{N} \frac{b_m}{b_1} y_{k-m+1}$$

We also have the feedback is given by $$u_{f,k} = -\sum_{i=1}^{N} k_i x_{i,k} = -\sum_{i=1}^{4} k_i y_{k-i+1}$$

We then write this as the feedback transfer function as $$H_f(z) = \frac{V(s)}{Y(s)} = -\frac{\sum_{i=1}^{N} k_i z^{-i+1}}{\sum_{m=1}^{N} b_m z^{-m+1}}$$

The following is an example with two poles.

Figure 44:
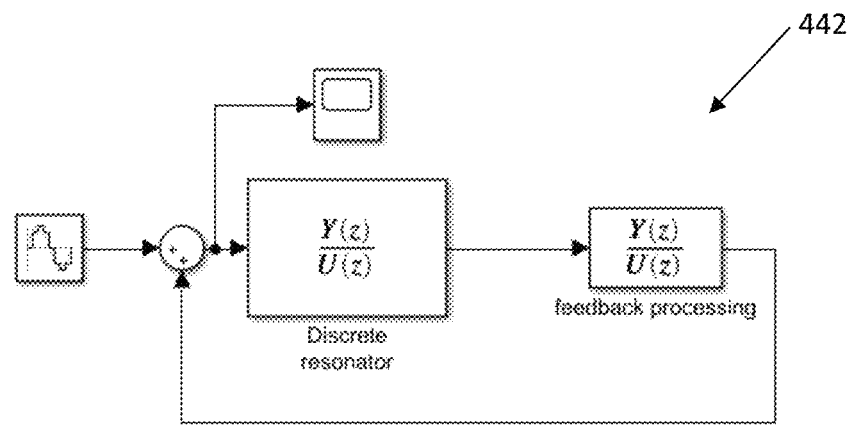
FIG. 44 is a schematic diagram of an AMPP feedback loop.

Referring to FIG. 44, the loop for the general AMPP model 442 is now fairly simple, consisting only of a filter for the feedback processing.

Figure 45:
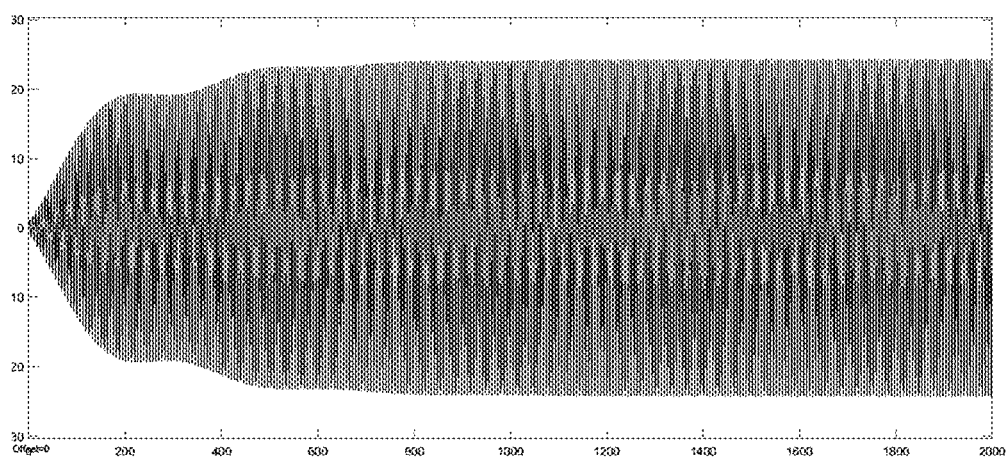
FIG. 45 is a plot of an AMPP output.

FIG. 45 shows the time domain simulation response when the normalized input oscillator is 1 rad/sec and an amplitude of 1 is switched on. The horizontal time axis is in clock cycles. Note that the AMPP is stable after some 800 clock cycles.

Determining the Feedback Processing Based on Nyquist Stability Criteria

As the number of resonators increases, it may become numerically more of an issue to work with the transfer function in terms of poles and zeros directly. Alternatively, it is possible to work with the Nyquist resonator curve (NRC). The NRC includes all frequency dependent components of the open loop response. Representing the open loop response graphically makes it easier to achieve desired characteristics of the closed loop response by deforming the NRC around the operating point.

Let $H_{res}(z)$ be the transfer function of the resonators in the z domain. This may be determined directly from the frequency measurements of the resonator or it may be a pole zero transfer function model of the resonator that is converted into the discrete time domain $H_{fb}(z)$ is the DSP processing which is an exact representation of what is implemented with the exception of the signal quantization. The NRC is then formed from the open loop response of $H_{res}(z)H_{fb}(z)$ which is plotted in the complex z-plane.

Figure 46:
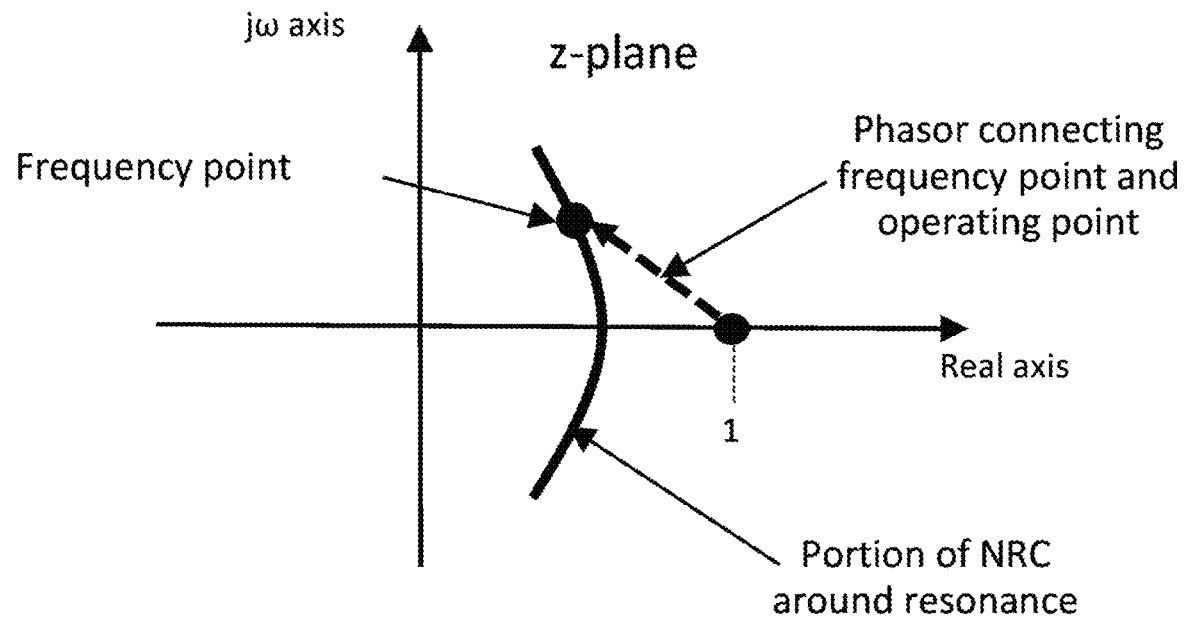
FIG. 46 is a plot of a section of NRC for the region around the resonance point.

The NRC sketched for a one pole equivalent open loop is shown in FIG. 46. A portion of the NRC is shown for the region around the resonance frequency. The operating point must be to the right of the NSC for stability and on the real axis. If it is on the left side of the NRC, then the AMPP is unstable.

The frequency response is given approximately by the inverse of the phasor connecting the operating point to the frequency point on the NRC. As observed here, the phasor length grows as the frequency moves away from the closed loop resonance point. The closed loop resonance point is defined as the intercept point of the NRC and the real axis.

Figure 47:
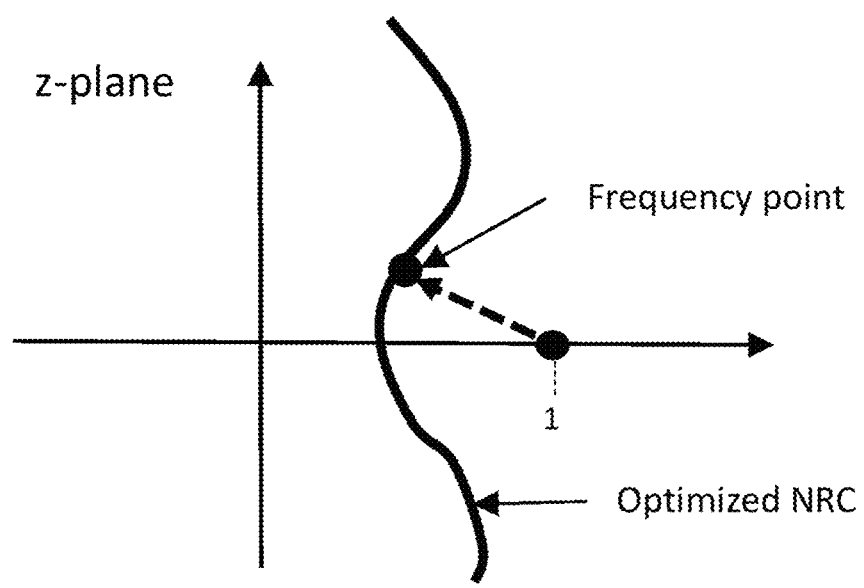
FIG. 47 is a plot of a simulated NRC optimized for a relatively flat passband over the desired bandwidth around the closed loop resonance frequency.

The objective is to optimize $H_{fb}(z)$ such that the NRC has the desired shape. An example of this is shown in FIG. 47 where $H_{fb}(z)$ has been determined such that the phasor of FIG. 46 has a near constant length over the desired closed loop bandwidth of the AMPP.

Figure 48:
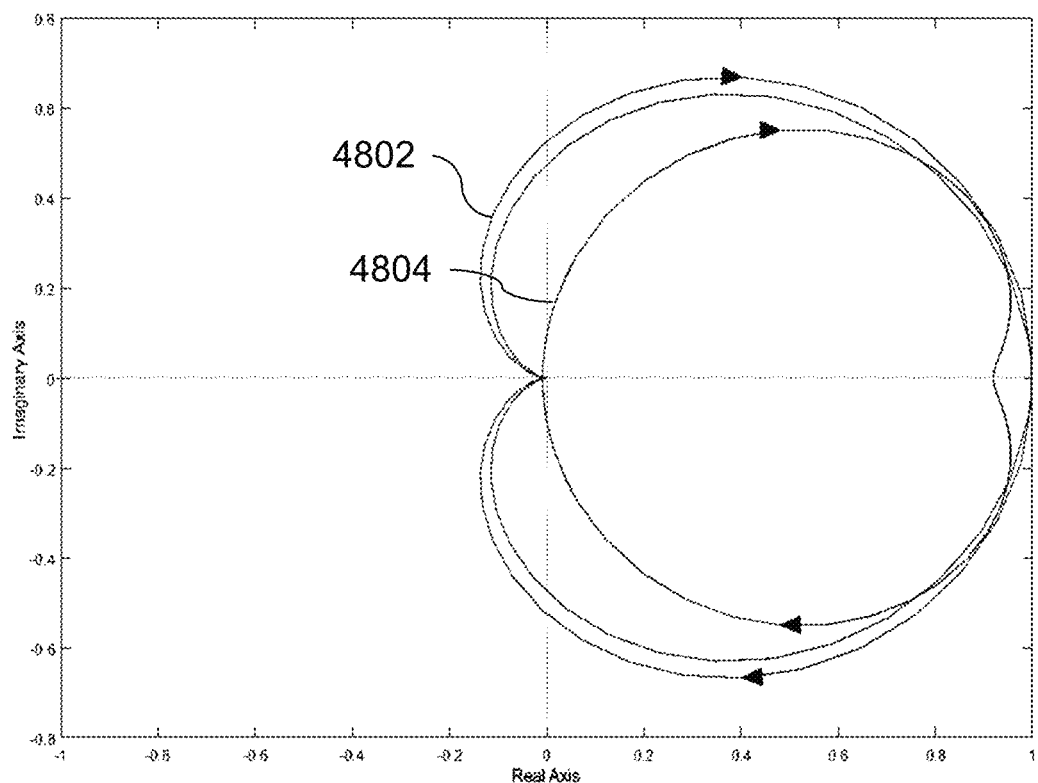
FIG. 48 is a plot of a simulated NRC for a two pole resonator and optimized feedback DSP to provide a flat passband response around the closed loop resonance frequency.

FIG. 48 shows a simulated NRC of a two pole resonator with optimized pole placement based on setting the desired closed loop resonator pole positions. The operating point is on the real axis at a value of 1. Curve 4802 is the NRC of the two-pole resonator. Curve 4804 is the NRC of the open loop transfer function of $H_{res}(z)H_{fb}(z)$. Note the indentation of the open loop NRC around the resonance frequency that results in the flat passband response.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

What is claimed is:

1. A method of processing an RF signal, comprising:
coupling an input signal into a signal loop, the signal loop comprising a resonator and a processing block;
filtering the input signal in the signal loop to produce an output signal by:
processing an output of the resonator in the processing block to generate a feedback signal, the feedback signal being connected to a point upstream of the resonator;
wherein processing the output of the resonator comprises a domain transfer using discrete time samples; and
the signal loop is definable by a transfer function having one or more poles, and the output of the resonator is processed such that the one or more poles of the transfer function are independently controllable.

2. The method of claim 1, wherein the output of the resonator is processed in parallel paths to generate a plurality of feedback signals that are connected to the point upstream of the resonator, and at least one of the parallel paths comprises the domain transfer.

3. The method of claim 2, further comprising the step of independently adjusting the processing in one or more of the parallel paths.

4. The method of claim 1, wherein the resonator comprises a non-uniform frequency response.

5. The method of claim 1, wherein the resonator comprises a multi-pole resonator, a plurality of resonators, or combinations thereof.

6. The method of claim 1, wherein the processing block synthesizes one or more poles, one or more zeroes, or one or more poles and one or more zeroes.

7. The method of claim 1, wherein the output of the resonator is obtained at multiple points in series along the resonator.

8. The method of claim 1, wherein the output of the resonator comprises a plurality of time-delayed signals from the resonator.

9. The method of claim 1, wherein the processing block comprises one or more feedback loops, one or more feedforward paths, or combinations of one or more feedback loops and one or more feedforward paths.

10. The method of claim 1, wherein the transfer function has a plurality of poles.

11. The method of claim 1, wherein the transfer function further has one or more zeroes.

12. An apparatus for processing an RF signal, comprising:
a signal loop comprising an input, an output, a resonator, and a feedback path connected to receive an output of the resonator, the feedback path having a feedback output connected upstream of the resonator, wherein the feedback path comprises a processing block and is configured to process the output of the resonator and introduce a feedback output signal at the feedback output;
wherein the processing block applies a domain transfer using discrete time samples; and
the signal loop is definable by a transfer function having one or more poles, and the processing block is configured to process the output of the resonator such that the one or more poles of the transfer function are independently controllable.

13. The apparatus of claim 12, wherein the processing block processes the output of the resonator in parallel paths.

14. The apparatus of claim 12, wherein the feedback path comprises a signal path in parallel to the processing block.

15. The apparatus of claim 12, wherein the resonator comprises a non-uniform frequency response.

16. The apparatus of claim 12, wherein the resonator comprises a multi-pole resonator, a plurality of resonators, or a plurality of resonators comprising at least one multi-pole resonator.

17. The apparatus of claim 12, wherein the processing block is configured to synthesize one or more poles, one or more zeroes, or one or more poles and one or more zeroes.

18. The apparatus of claim 12, wherein the output of the resonator is obtained at multiple points in series along the resonator or comprise time-delayed signals from the resonator.

19. The apparatus of claim 12, wherein the processing block comprises one or more feedback paths, one or more feedforward paths, or combinations of one or more feedback loops and one or more feedforward paths.

20. The apparatus of claim 12, wherein the transfer function has a plurality of poles.

21. The apparatus of claim 12, wherein the transfer function further has one or more zeroes.

22. A method of processing an RF signal, comprising:
coupling an input signal into a signal loop, the signal loop comprising a resonator; and
filtering the input signal in the signal loop to produce an output signal by:
obtaining a plurality of resonator outputs from the resonator; and
processing the plurality of resonator outputs to generate feedback signals upstream of the resonator in a first path and a second path that is connected in parallel with the first path, wherein the second path comprises a domain transformation using discrete time samples;
wherein the signal loop is definable by a transfer function, and the plurality of resonator outputs are processed such that poles of the transfer function are individually controllable.

* * * * *